(12) United States Patent
Tao et al.

(10) Patent No.: US 12,191,376 B2
(45) Date of Patent: Jan. 7, 2025

(54) POWER DEVICE AND METHOD FOR MAKING THE SAME

(71) Applicant: XIAMEN SAN'AN INTEGRATED CIRCUIT CO., LTD., Xiamen (CN)

(72) Inventors: Yonghong Tao, Xiamen (CN); Wenbi Cai, Xiamen (CN); Shaodong Xu, Xiamen (CN); Jinpeng Guo, Xiamen (CN); Yongtian Zhou, Xiamen (CN); Hongxing Hu, Xiamen (CN); Yong Wang, Xiamen (CN)

(73) Assignee: XIAMEN SAN'AN INTEGRATED CIRCUIT CO., LTD., Fujian (CN)

( * ) Notice: Subject to any disclaimer, the term of this patent is extended or adjusted under 35 U.S.C. 154(b) by 262 days.

(21) Appl. No.: 17/705,906

(22) Filed: Mar. 28, 2022

(65) Prior Publication Data
US 2022/0310822 A1    Sep. 29, 2022

(30) Foreign Application Priority Data

Mar. 29, 2021    (CN) .......................... 202110337338.6
Jun. 29, 2021    (CN) .......................... 202110724386.0
Jun. 29, 2021    (CN) .......................... 202110725060.X

(51) Int. Cl.
*H01L 29/66*    (2006.01)
*H01L 29/06*    (2006.01)
*H01L 29/872*   (2006.01)

(52) U.S. Cl.
CPC .... *H01L 29/66143* (2013.01); *H01L 29/0649* (2013.01); *H01L 29/6606* (2013.01); *H01L 29/872* (2013.01)

(58) Field of Classification Search
CPC ............. H01L 29/0649; H01L 29/6606; H01L 29/66143; H01L 29/872
USPC ...................................................... 257/211
See application file for complete search history.

(56) References Cited

U.S. PATENT DOCUMENTS 9,478,673 B2 * 10/2016 Aketa ................... H01L 29/045

\* cited by examiner

*Primary Examiner* — Monica D Harrison
(74) *Attorney, Agent, or Firm* — MUNCY, GEISSLER, OLDS & LOWE, P.C.

(57) ABSTRACT

A power device includes a substrate, a drift layer disposed on the substrate, a terminal region and an active region disposed in the drift layer, an electrode layer disposed on the active region, a Schottky contact layer disposed between the electrode layer and the active region, a passivation layer disposed on the drift layer, and an isolation layer disposed between the passivation layer and the electrode layer so that the passivation layer and the electrode layer are at least partially separated from each other. The isolation layer, the electrode layer, and the passivation layer each respectively has a thermal expansion coefficient a, b, c, and a>b>c.

27 Claims, 30 Drawing Sheets

POWER DEVICE AND METHOD FOR MAKING THE SAME

CROSS-REFERENCE TO RELATED APPLICATION

This application claims priorities of Chinese Invention Patent Application No. 202110337338.6, filed on Mar. 29, 2021, Chinese Invention Patent Application 202110725060.X, filed on Jun. 29, 2021, and Chinese Invention Patent Application No. 202110724386.0, filed on Jun. 29, 2021. The entire content of the Chinese patent applications is incorporated herein by reference.

FIELD

The disclosure relates to a semiconductor device, and more particularly to a power device, a method for making the power device, and a passivation structure for the power device.

BACKGROUND

Power semiconductor devices serve as core devices in power electronic circuits to achieve efficient transmission and efficient conversion of electrical energy and precise control of the power electronic circuits, so as to fulfill high quality and efficient use of electrical energy. Due to the development of power semiconductor devices, power electronics technology has moved in the direction of miniaturization, high capacity, high frequency, energy efficiency, high reliability and low cost.

Conventional semiconductor power devices are usually covered by a passivation layer that extends to a surface of a frontal electrode from a terminal region of the conventional power device to prevent external water vapor and ions (e.g., sodium) from affecting an internal structure of the semiconductor power device. However, when such semiconductor power devices are subjected to reliability tests such as TCT (Thermal Cycle Test) or TS (Thermal Shock), due to a mismatch in thermal expansion coefficients of a resin package, the frontal electrode and the passivation layer, the surface of the frontal electrode and the passivation layer will crack, which will cause water vapor and ions to enter the power device through the cracks, resulting in degradation and even failure of the semiconductor power devices.

SUMMARY

Therefore, an object of the disclosure is to provide a power device, a passivation structure, and a method for manufacturing a power device that can alleviate at least one of the drawbacks of the prior art.

According to a first aspect of the disclosure, the power device includes a substrate, a drift layer, a terminal region, an active region, an electrode layer, a Schottky contact layer, a passivation layer, and an isolation layer.

The drift layer is disposed on the substrate. The terminal region and the active region is disposed in the drift layer, the active region being located at a side of the terminal region. The electrode layer is disposed on the active region. The Schottky contact layer is disposed between the electrode layer and the active region. The passivation layer is disposed on the drift layer. The isolation layer is disposed between the passivation layer and the electrode layer so that the passivation layer and the electrode layer are at least partially separated from each other. The isolation layer has a thermal expansion coefficient a, the electrode layer has a thermal expansion coefficient b, the passivation layer has a thermal expansion coefficient c, and a>b>c.

According to a second aspect of the disclosure, the power device includes a substrate, a drift layer, a terminal region, an active region, an electrode layer, a Schottky contact layer, and a passivation layer.

The drift layer is disposed on the substrate. The terminal region and the active region is disposed in the drift layer, the active region being located at a side of the terminal region. The electrode layer is disposed on the active region. The Schottky contact layer is disposed between the electrode layer and the active region. The passivation layer is disposed on the drift layer. A portion of the passivation layer directly connects to a side wall of the electrode layer.

According to a third aspect of the disclosure, a method for manufacturing the power device includes: providing a power structure that includes a substrate, a drift layer disposed on the substrate, an active region disposed in the drift layer, a terminal region disposed in the drift layer and surrounds the active region, a dielectric layer disposed on the drift layer and extending from a periphery of the active region to cover the terminal region, an electrode layer disposed on the active region, and a Schottky contact layer disposed between the active region and the electrode layer; forming an isolation layer on the electrode layer; and forming a passivation layer that covers at least a portion of the isolation layer and extends in a direction toward the terminal region, the passivation layer and the electrode layer being separated by the isolation layer.

The electrode layer has a mesa portion that extends above the dielectric layer, the mesa portion having a side wall proximate to the dielectric layer and a top surface distal from the drift layer. The side wall of the mesa portion is connected to the dielectric layer.

According to a fourth aspect of the disclosure, a method for manufacturing the power device includes: providing a first power structure that includes a substrate, a drift layer disposed on the substrate, an active region and a terminal region disposed in the drift layer distal from the substrate, a dielectric layer disposed on the drift layer and extending from a periphery of the active region to cover the terminal region, an electrode layer disposed on the active region, the electrode layer having a mesa portion that extends above the dielectric layer, the mesa portion having a side wall proximate to the dielectric layer and a top surface distal from the drift layer, the side wall of the mesa portion being connected to the dielectric layer so that an included angle is formed between the mesa portion and the dielectric layer, and a Schottky contact layer disposed between the active region and the electrode layer; forming an isolation layer on the electrode layer and the dielectric layer, the isolation layer having a slope surface extending in a direction from the side wall of the mesa portion toward the dielectric layer and away from the side wall; forming a photoresist on the isolation layer; patterning the photoresist so as to form a through hole in the photoresist that exposes a part of the isolation layer disposed on a central region of the electrode layer; patterning the isolation layer to remove the part of the isolation layer exposed from the through hole; forming a passivation layer that covers at least a portion of the isolation layer, the passivation layer and the electrode layer being at least partially separated by the isolation layer.

The isolation layer has a thermal expansion coefficient a, the electrode layer has a thermal expansion coefficient b, the passivation layer has a thermal expansion coefficient c, and a>b>c.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
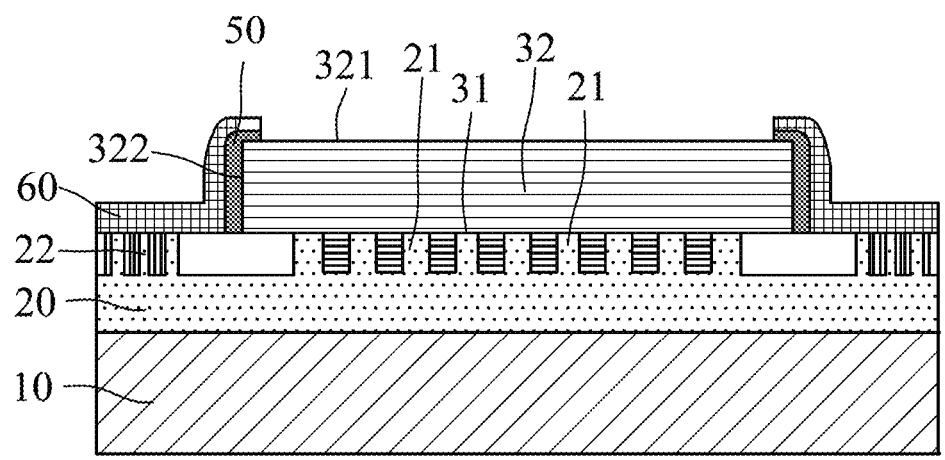
FIG. 1 is a schematic view illustrating a first embodiment of a power device in accordance with some embodiments of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

The embodiments set forth below provide information necessary to enable a person skilled in the art to practice the described embodiments. After reading the following descriptions with reference to the accompanying drawings, one skilled in the art will understand the concepts of the present disclosure and will recognize applications of those concepts not specifically set forth herein. It should be understood that these concepts and applications fall within the scope of the present disclosure and the accompanying claims.

It should be understood that while the terms: first, second, etc., may be used herein to describe various components, these components should not be limited by these terms. These terms are used only to distinguish one element from another. For example, without departing from the scope of the present disclosure, a first element may be referred to as a second element, and similarly, a second element may be referred to as a first element. As used herein, the term "and/or" includes any and all combinations of one or more of the listed items that are associated.

It should be understood that, when an element (such as a layer, region, or substrate) is referred to as "on another element" or "extending to another element", it may be directly on or extending directly to another element, or there may be other elements in between. Conversely, when an element is referred to as "directly on another element" or "directly extending to another element", there are no other elements in between. Similarly, it should be understood that, when an element (such as a layer, region, or substrate) is referred to as "on top of another element" or "extending on top of another element", it may be directly on top of another element or extending directly on top of another element, or there may also be other elements in between. Conversely, when an element is referred to as "directly on another element" or "extending directly on another element", there are no other elements in between. It should also be understood that when an element is referred to as "connected to" or "coupled to" another element, it may be directly connected or coupled to another element, or there may be an intervening element. Conversely, when an element is said to be "directly connected" or "directly coupled" to another element, there is no intervening element.

Terms, such as "below", "above", "upper", "lower", "horizontal" or "vertical" may be used herein to describe the relationship of one element/layer/region to another element/layer/region, as shown in the figures. It should be understood that these terms and those discussed above are intended to cover different orientations of the device other than those depicted in the drawings.

The terms used herein are used only for the purpose of describing a particular embodiment and are not intended to limit the present disclosure. As used herein, the singular forms "one," "a," and "said" are intended to include plural forms as well, unless the context clearly indicates otherwise. It should also be understood that, when used herein, the term "include(s)" indicates the presence of the described features, integers, steps, operations, components, and/or parts, but does not preclude the presence or addition of one or more other feature(s), integer(s), step(s), operation(s), component (s), part(s), and/or group(s) of the foregoing.

Unless otherwise defined, all terms used herein (including technical terms and scientific terms) have the same meaning as commonly understood by a person of ordinary skill in the art to which the present disclosure belongs. It should also be understood that the terms used herein should be interpreted to mean what they mean in the context of the present specification and related fields, and not in an idealized or overly formal sense, unless explicitly defined as such herein.

Referring to FIG. 1, a first embodiment of a power device 100 according to the present disclosure is provided. The power device 100 includes a substrate 10, a drift layer 20 disposed on the substrate 10 in a laminating direction, a terminal region 22 and an active region 21 disposed in the drift layer 20, an electrode layer 32 disposed on the active region 21 in the laminating direction, a Schottky contact layer disposed between the active region 21 and the electrode layer 32, an isolation layer 50 disposed on the electrode layer 32, and a passivation layer 60 disposed on the drift layer 20 and completely or partially covering the isolation layer 50. The passivation layer 60 extends on the terminal region 22, and the isolation layer 50 is disposed between the passivation layer 60 and the electrode layer 32 to completely or partially separate the passivation layer 60 from the electrode layer 32. The active region 21 is surrounded by the terminal region 22. The isolation layer 50 has a thermal expansion coefficient a, the electrode layer 32 has a thermal expansion coefficient b, the passivation layer 60 has a thermal expansion coefficient c, and a>b>c.

Separation of the passivation layer 60 from the electrode layer 32 by the isolation layer 50 and the design of the thermal expansion coefficients (i.e., a>b>c) may prevent cracking of the passivation layer 60 when the passivation layer 60 is subjected to stress caused by thermal cycling during reliability testing, thereby effectively solving the problem of device reliability degradation caused by cracking of the passivation layer 60 after a thermal cycle test (TCT).

In some embodiments, the substrate 10 is a wide-bandgap substrate. In some embodiment, the substrate 10 is an N-type silicon carbide wide-bandgap substrate. In certain embodiments, the substrate 10 has a crystal structure of 4H-SiC. In some embodiments, the substrate 10 has a thickness of about 350 μm. In some embodiments, the substrate 10 has a doping concentration ranging between about $1 \times 10^{19}/cm^3$ and about $1 \times 10^{20}/cm^3$. It should be understood that the abovementioned crystal structure, thickness, and doping concentration of the substrate 10 are only examples provided for some embodiments of the present disclosure and are not the limitations of the present disclosure.

In some embodiments, the drift layer 20 has a thickness that may range between about 5 μm and about 80 μm, for example, the thickness may be 5 μm, 10 μm, 30 μm, 50 μm, 70 μm, or 80 μm, etc., but not limited thereto. In certain embodiments, the drift layer 20 may have a doping concentration ranging between about $1 \times 10^{14}/cm^3$ and about $5 \times 10^{16}/cm^3$. In certain embodiments, the drift layer 20 is a wide-bandgap drift layer.

In certain embodiments, the active region 21 in the drift layer 20 may take a form, of, for example, but not limited to, a bar, a hexagon, or a combination of a bar and a hexagon.

In some embodiments, the Schottky contact layer 31 may have a thickness that ranges from about 100 nm to about 500 nm. For example, the thickness of the Schottky contact layer 31 may be about 100 nm, 200 nm, 300 nm, 400 nm, or 500 nm, etc., but not limited thereto. In some embodiments, the Schottky contact layer 31 may include a material of Ti, N, Ta, Ni, Mo, Pt, or combinations thereof, but not limited thereto.

In some embodiments, the electrode layer 32 may have a thickness ranging from about 2 μm to about 5 μm. Exemplarily, the thickness of the electrode layer 32 may be 2 μm, 3 μm, 4 μm, or 5 μm, etc., but not limited thereto. The electrode layer 32 may include a material of, for example, but not limited to, Al, Ag, Cu, Au, or combinations thereof.

In some embodiments, the isolation layer 50 is disposed on the electrode layer 32. The isolation layer 50 is provided to completely or partially separate the passivation layer 60 from the electrode layer 32. The isolation layer 50 may be made from a polyimide material. The polyimide material has a certain degree of elasticity, so that, when the power device is subjected to the TCT test, the cracking problem of the passivation layer 60 caused by the stress generated by compression between the passivation layer 60 and the electrode layer 32 can be effectively alleviated or avoided, thereby improving device reliability.

In some embodiments, the passivation layer 60 has a thickness that ranges from about 1 μm to about 3 μm. For example, the thickness of the passivation layer 60 may be 1 μm, 2 μm, or 3 μm, but not limited thereto. In some embodiments, the passivation layer 60 may be made of a material of silicon oxide (e.g., $SiO_2$) or silicon nitride (e.g., $Si_3N_4$).

The power device 100 according to the present disclosure may be, for example, a general purpose Schottky diode, a junction barrier Schottky diode, or a merged PiN Schottky diode, but not limited thereto.

In some embodiments, the isolation layer 50 is used to completely separate the passivation layer 60 from the electrode layer 32. In some other embodiments, the isolation layer 50 is used to partially separate the passivation layer 60 from the electrode layer 32. The following examples are given to illustrate complete separation and partial separation of the passivation layer 60 and the electrode layer 32.

In some embodiments, as shown in FIG. 1, the electrode layer 32 has a top surface 321 distal from the drift layer 20 and a side wall 322 proximate to the terminal region 22. The isolation layer 50 extends from a periphery of the top surface 321 of the electrode layer 32 and covers the side wall 322. The passivation layer 60 is configured to extend from the isolation layer 50 at the top surface 321 of the electrode layer 32 along the isolation layer 50 on the side wall 322 toward the terminal region 22. In this case, the isolation layer 50 completely separates the passivation layer 60 from the electrode layer 32.

Figure 2:
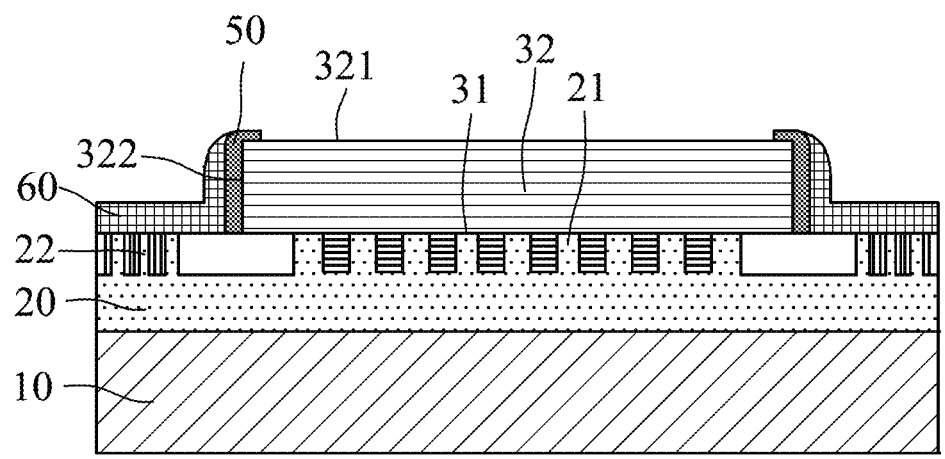
FIG. 2 is a schematic view illustrating a variation of the first embodiment of the power device in accordance with some embodiments of the present disclosure.

In some other embodiments, as shown in FIG. 2, the electrode layer 32 has a top surface 321 distal from the drift layer 20 and a side wall 322 proximate to the terminal region 22. The isolation layer 50 extends from a periphery of the top surface 321 of the electrode layer 32 and covers the side wall 322. The passivation layer 60 is flush with a top surface of the isolation layer 50 and extends toward the terminal region 22 along the isolation layer 50 on the side wall 322. In this case, the isolation layer 50 also completely separates the passivation layer 60 from the electrode layer 32.

Figure 3:
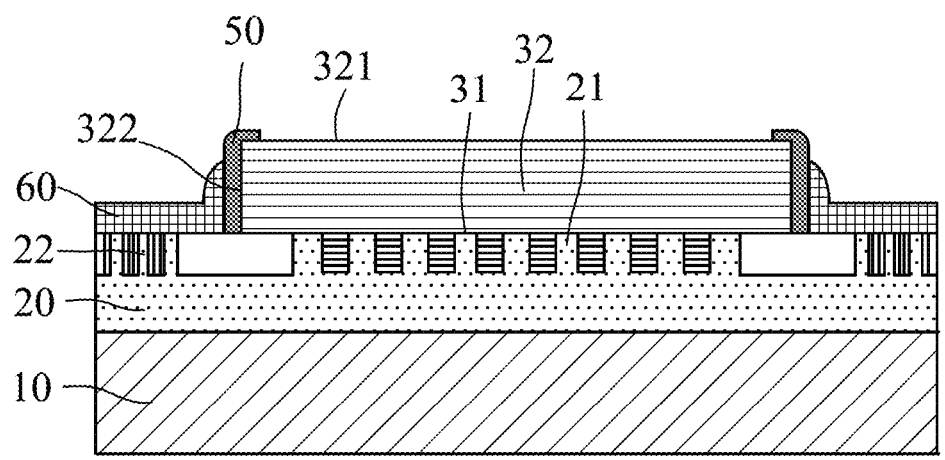
FIG. 3 is a schematic view illustrating a variation of the first embodiment of the power device in accordance with some embodiments of the present disclosure.

In some embodiments, as shown in FIG. 3, the isolation layer 50 has a height measured from the drift layer 20, and the passivation layer 60 is configured to extend from the isolation layer 50 proximate to the terminal region 22 at more than half of the height of the isolation layer 50 in a direction toward the terminal region 22. In this case, the isolation layer 50 also completely separates the passivation layer 60 from the electrode layer 32.

Figure 4:
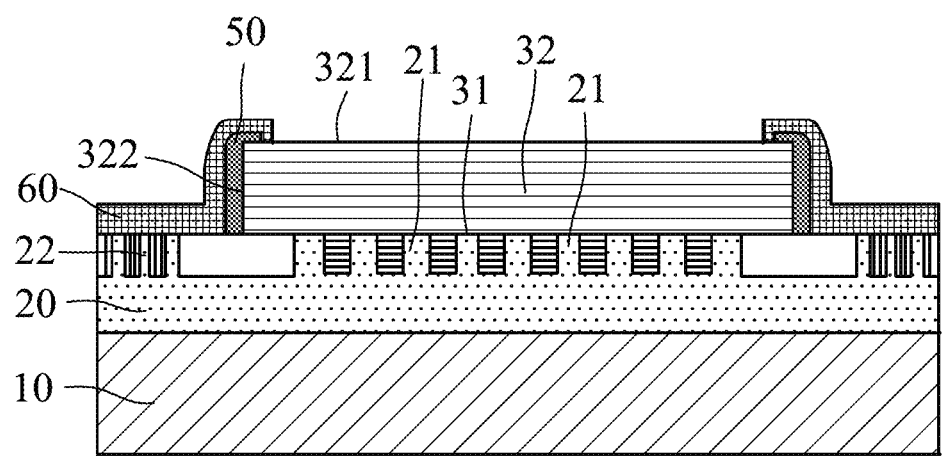
FIG. 4 is a schematic view illustrating a variation of the first embodiment of the power device in accordance with some embodiments of the present disclosure.

In some embodiments, as shown in FIG. 4, the passivation layer 60 is configured to cover a portion of the top surface 321 of the electrode layer 32 and extend in a direction toward the terminal region 22 along the isolation layer 50 on the top surface 321 and the side wall 322 of the electrode layer 32. In this case, the isolation layer 50 partially separates the passivation layer 60 from the electrode layer 32, and the passivation layer 60 is in contact with the electrode layer 32 at the top surface 321 of the electrode layer 32.

Figure 5:
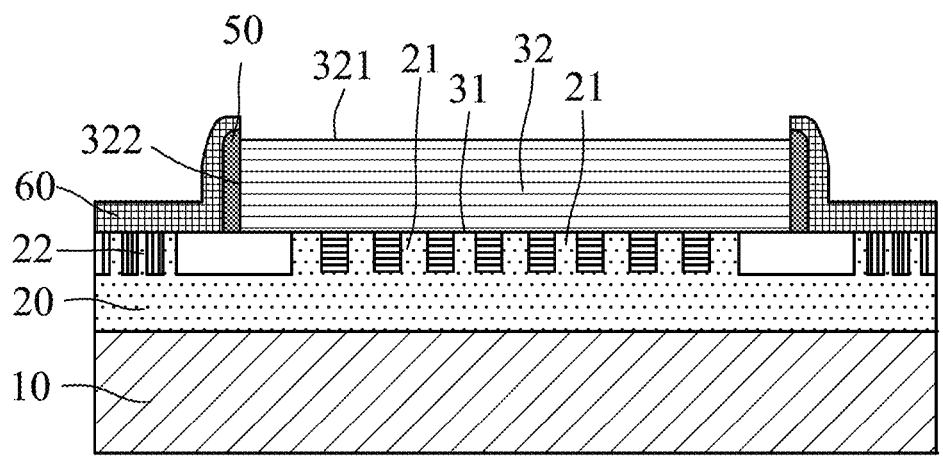
FIG. 5 is a schematic view illustrating a variation of the first embodiment of the power device in accordance with some embodiments of the present disclosure.

In some embodiments, as shown in FIG. 5, the isolation layer 50 is configured to be flush with the top surface 321 of the electrode layer 32 and extend in a direction toward the drift layer 20. The passivation layer 60 is configured to completely cover the isolation layer 50 but not to cover the top surface 321 of the electrode layer 32, and to extend toward the terminal region 22. In this case, the isolation layer 50 may completely separate the passivation layer 60 from the electrode layer 32.

Figure 6:
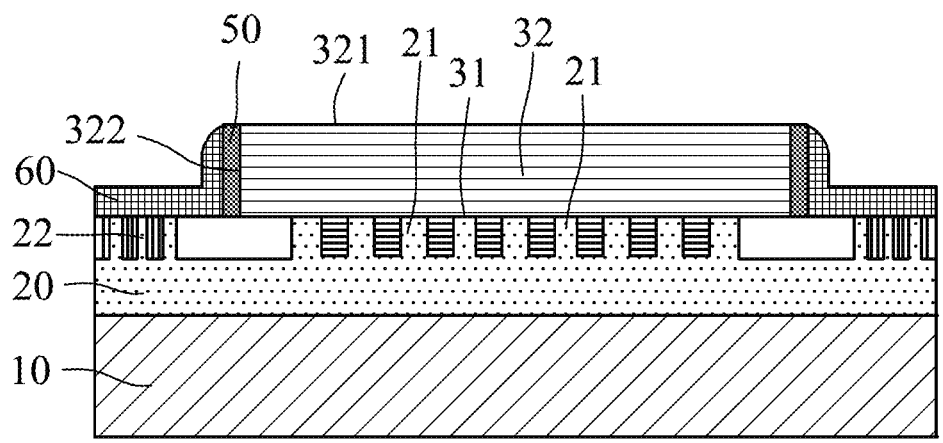
FIG. 6 is a schematic view illustrating a variation of the first embodiment of the power device in accordance with some embodiments of the present disclosure.

In some embodiments, as shown in FIG. 6, the isolation layer 50 is flush with the top surface 321 of the electrode layer 32 but does not cover the top surface 321 of the electrode layer 32, and extends in a direction toward the drift layer 20. The passivation layer 60 is also flush with the top surface of the isolation layer 50 and extends in a direction toward the terminal region 22. In this case, the isolation layer 50 also completely separates the passivation layer 60 from the electrode layer 32.

Figure 7:
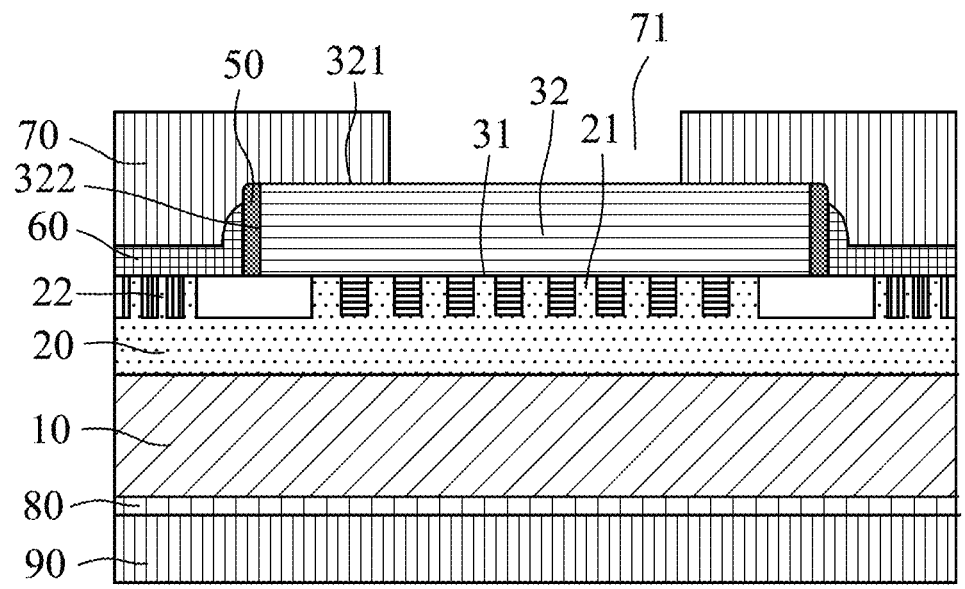
FIG. 7 is a schematic view illustrating a variation of the first embodiment of the power device in accordance with some embodiments of the present disclosure.

In some embodiments, as shown in FIG. 7, the isolation layer 50 is flush with the top surface 321 of the electrode layer 32 but does not cover the top surface 321 of the electrode layer 32, and extends in a direction toward the drift layer 20. The passivation layer 60 is configured to extend in a direction toward the terminal region 22 at more than half of the height of the isolation layer 50. In this case, the isolation layer 50 completely separates the passivation layer 60 from the electrode layer 32.

In some embodiments, as shown in FIG. 7, the power device 100 of the present disclosure further includes a protection layer 70 covering the passivation layer 60 and the electrode layer 32. In some embodiments, the protection layer 70 may be etched to form a through hole in the protection layer 70 that exposes a portion of the electrode layer 32, thereby forming a welding region 71 (as shown in FIG. 7). The protection layer 70 may be made from polyimide. In some embodiments, the protection layer 70 may have a thickness that ranges between about 3 μm and about 5 μm, for example, the thickness may be 3 μm, 4 μm, or 5 μm, but not limited thereto.

In some embodiments, as shown in FIG. 7, the power device 100 of the present disclosure may further include an ohmic contact layer 80 disposed on a surface of the substrate 10 distal from the drift layer 20, and a metal layer 90 disposed on a surface of the ohmic contact layer 80 distal from the substrate 10. The metal layer 90 may function as a back electrode and may have a thickness that ranges between about 2 μm and about 5 μm. The ohmic contact layer 80 may include a material of any one of Ni, Ti, Nb, and Mo, and the ohmic contact layer 80 may have a thickness that ranges between about 100 nm and about 500 nm.

Figure 8:
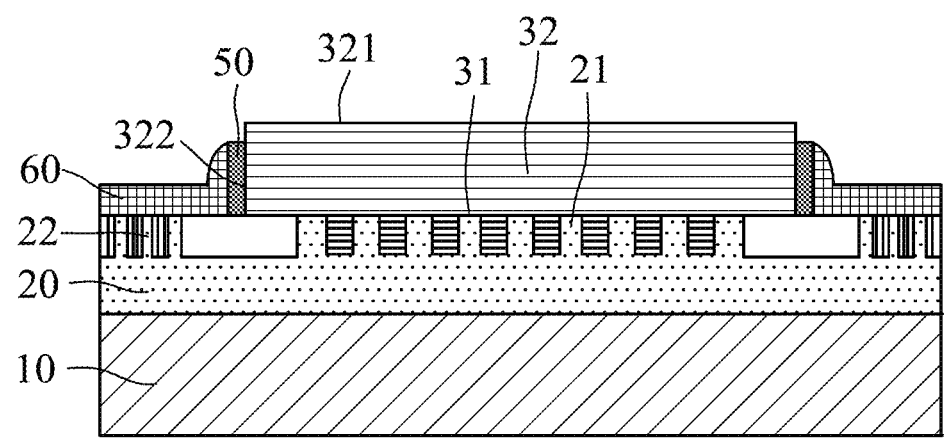
FIG. 8 is a schematic view illustrating a variation of the first embodiment of the power device in accordance with some embodiments of the present disclosure.

In some embodiments, as shown in FIG. 8, the isolation layer 50 is only disposed on the side wall 322 of the electrode layer 32, and the side wall 322 has a height measured from the drift layer 20. The isolation layer 50 is configured to extend from the side wall 322 at more than half of the height of the side wall 322 in a direction toward the drift layer 20, and the passivation layer 60 is flush with the top surface of the isolation layer 50 and extends in a direction toward the terminal region 22. In this case, the isolation layer 50 may completely separate the passivation layer 60 from the electrode layer 32.

Figure 9:
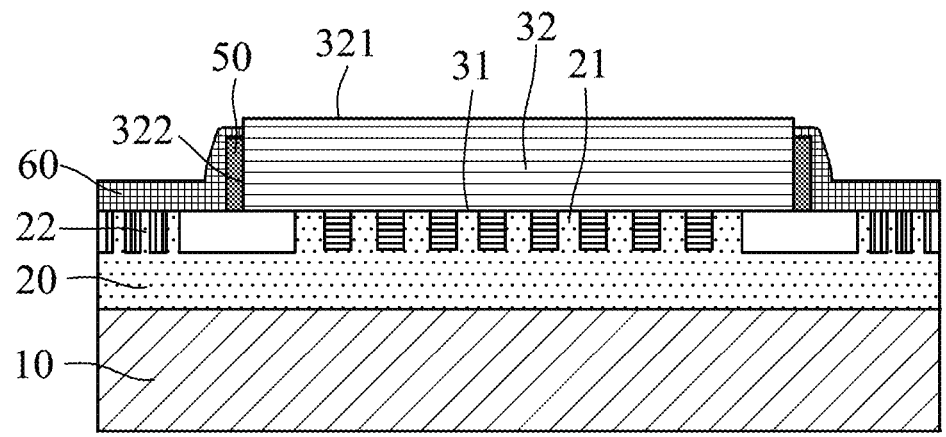
FIG. 9 is a schematic view illustrating a variation of the first embodiment of the power device in accordance with some embodiments of the present disclosure.

In some embodiments, as shown in FIG. 9, the isolation layer 50 is only disposed on the side wall 322, and the side wall 322 has a height measured from the drift layer 20. The isolation layer 50 is configured to extend from the side wall 322 at more than half of the height of the side wall 322 in a direction toward the drift layer 20, and the passivation layer 60 is configured to extend from the side wall 322 of the electrode layer 32 above the isolation layer 50 and extends in a direction toward the terminal region 22. In this case, the isolation layer 50 may partially separate the passivation layer 60 from the electrode layer 32, and the passivation layer 60 is partially in contact with the side wall 322 of the electrode layer 32.

It should be noted that, in some embodiments, when the terminal region 22 is disposed on opposite sides of the active region 21 in the drift layer 20, the design of the isolation layer 50 and the passivation layer 60 may be provided on one side of the active region 21 or on opposite sides of the active region 21.

Figure 10:
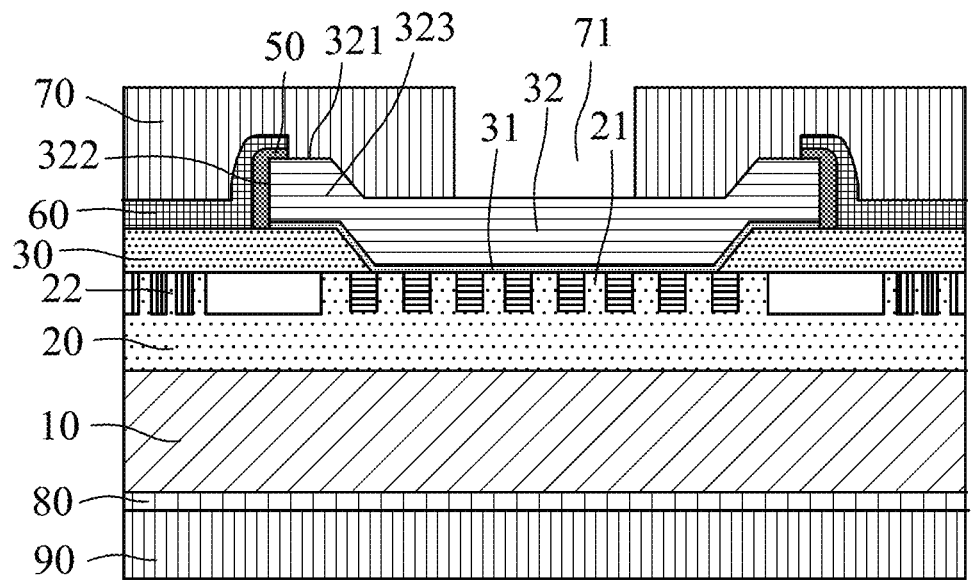
FIG. 10 is a schematic view illustrating a second embodiment of the power device in accordance with some embodiments of the present disclosure.

Referring to FIG. 10, the present disclosure provides a second embodiment of the power device 100. The second embodiment is similar to the first embodiment except that, the power device 100 further includes a dielectric layer 30 disposed on the drift layer 20. The isolation layer 50 is disposed on the electrode layer 32, and the passivation layer 60 completely or partially covers the isolation layer 50 and extends in a direction toward the terminal region 22. The isolation layer 50 completely or partially separates the passivation layer 60 from the electrode layer 32.

In some embodiments, as shown in FIG. 10, the dielectric layer 30 may have a thickness as desired by a person skilled in the art. In some embodiments, the dielectric layer 30 may be made from silicon oxide. The dielectric layer 30 is configured to extend from a periphery of the active region 21 to cover the terminal region 22 (i.e., the dielectric layer 30 covers a periphery of the active region 21 and covers the terminal region 22).

In some embodiments, a portion of the electrode layer 32 is disposed above the dielectric layer 30, as shown in FIG. 10 (i.e., the electrode layer 32 overlies the dielectric layer 30). The portion of the electrode layer 32 disposed on and extends above the portion of the dielectric layer 32 is referred to as a mesa portion 323 of the electrode layer 32. In some embodiments, the isolation layer 50 is disposed on the side wall (i.e., outer peripheral wall) 322 of the electrode layer 32. It is noted that, in the present disclosure, the area of the isolation layer 50 covering the side wall 322 is not specifically limited, as long as the isolation layer 50 is able to completely or partially separate the passivation layer 60 from the electrode layer 32.

In some embodiments, in the present disclosure, an area of the isolation layer 50 covered by the passivation layer 60 is not specifically limited, as long as the isolation layer 50 is able to completely or partially separate the passivation layer 60 from the electrode layer 32.

FIGS. 10 to 18 correspond to FIGS. 1 to 9 in order. Therefore, descriptions regarding position, configuration, and connection relationship among the components in FIGS. 10 to 18 are similar to those in FIGS. 1 to 9. Hence, such descriptions are omitted herein for the sake of brevity.

Figure 19:
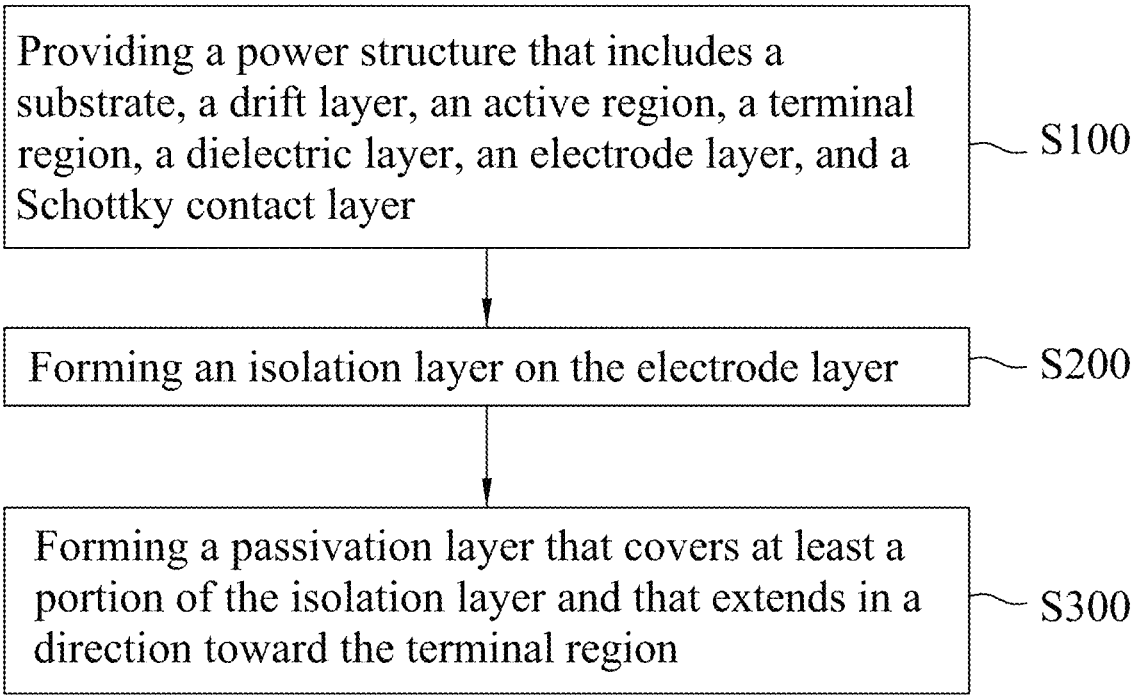
FIG. 19 is a flow diagram illustrating a first method for making the power device in accordance with some embodiments of the present disclosure.

Referring to FIG. 19, the present disclosure provides a first method for preparing the power device 100 in accordance with some embodiments of the present disclosure (e.g., the second embodiment of the present disclosure), which includes the following steps.

Figure 20:
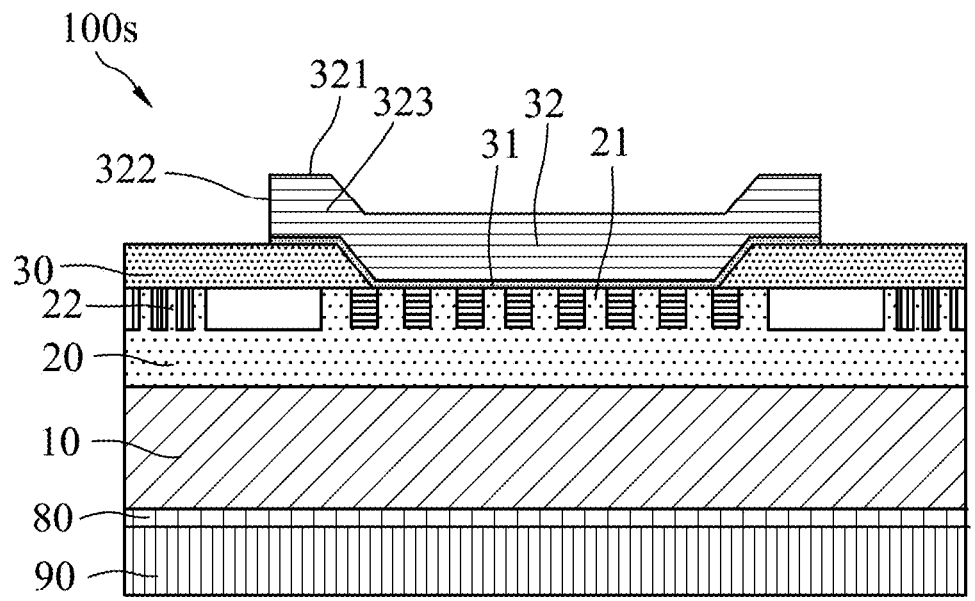
FIGS. 20 to 22 are schematic views illustrating intermediate stages of the first method depicted in FIG. 19 in accordance with some embodiments.

S100: Providing a power structure 100s. As shown in FIG. 20, the power structure 100s includes: the substrate 10, the drift layer 20 disposed on the substrate 10, the active region 21 disposed in the drift layer 20, the terminal region 22 disposed in the drift layer 20 and surrounds the active region 21, the dielectric layer 30 disposed on the drift layer 20, the electrode layer 32 disposed on the active region 21, and the Schottky contact layer 31 disposed between the electrode layer 32 and the active region 21. The electrode layer 32 includes the mesa portion 323 that extends above the dielectric layer 30, and the mesa portion 323 has the top surface 321 distal from the drift layer 20 and the side wall 322 proximate to the dielectric layer 30. The side wall 322 of the mesa portion 323 is connected to the dielectric layer 30. The dielectric layer 30 is configured to cover the terminal region 22 from a periphery of the active region 21.

S200: Forming an isolation layer 50 on the electrode layer 32, as shown in FIG. 21.

Figure 22:
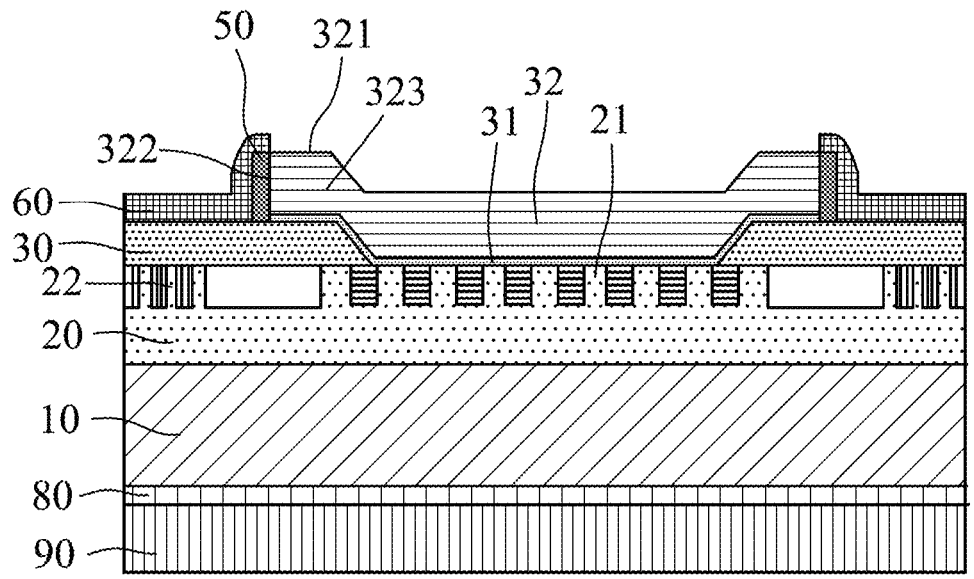

S300: Forming a passivation layer 60 that covers at least a portion of the isolation layer 50 and that extends in a direction toward the terminal region 22, as shown in FIG. 22.

The first method provided in the present disclosure completely or partially separates the passivation layer 60 from the electrode layer 32 by the isolation layer 50. With the presence of the isolation layer 50 and the design of the thermal expansion coefficients (i.e., a>b>c), the cracking problem of the passivation layer 60 may be alleviated or avoided when the passivation layer 60 is suffered from stress caused by thermal cycling, thus effectively solving the problem of device reliability degradation.

Figure 21:
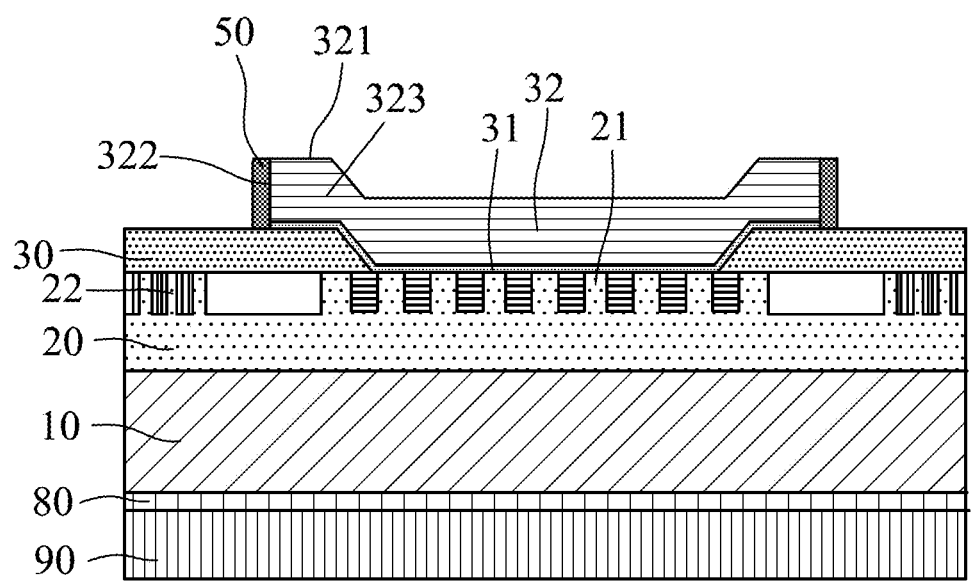

In some embodiments, as shown in FIG. 21, in step S200, when the isolation layer 50 is formed on the electrode layer 32, the side wall of the isolation layer 50 is the peripheral wall of the isolation layer 50.

Figure 18:
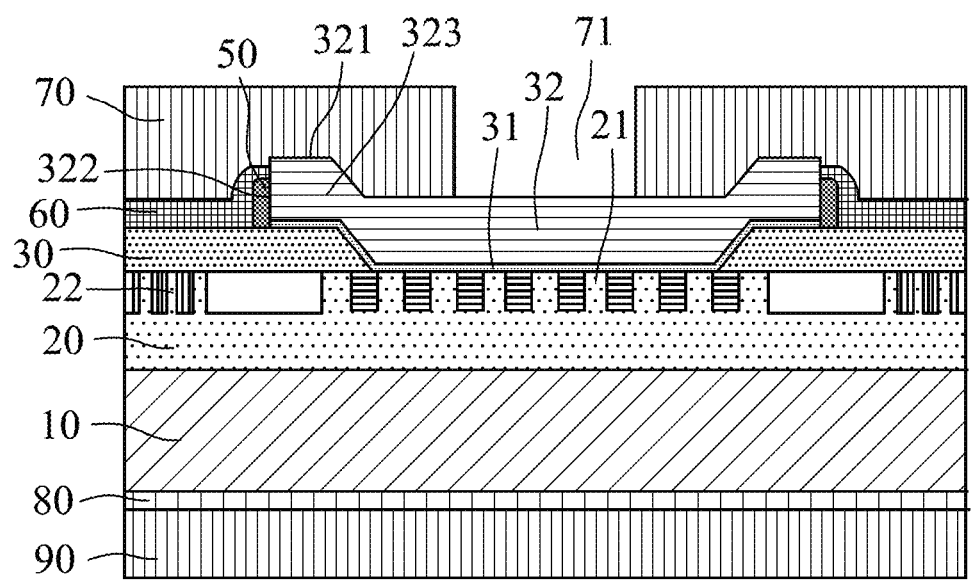
FIG. 18 is a schematic view illustrating a variation of the second embodiment of the power device in accordance with some embodiments of the present disclosure.

In some embodiments, as shown in FIG. 18, after step S300, the first method may further include the steps of: forming the protection layer 70, the ohmic contact layer 80, and the metal layer 90. The order for forming the protection layer 70, the ohmic contact layer 80, and the metal layer 90 may be determined by a person skilled in the art according to common knowledge, and is not limited to the present disclosure.

In some embodiments, the metal layer 90 is located on a surface of the ohmic contact layer 80 distal from the substrate 10, as shown in FIG. 22.

Figure 23:
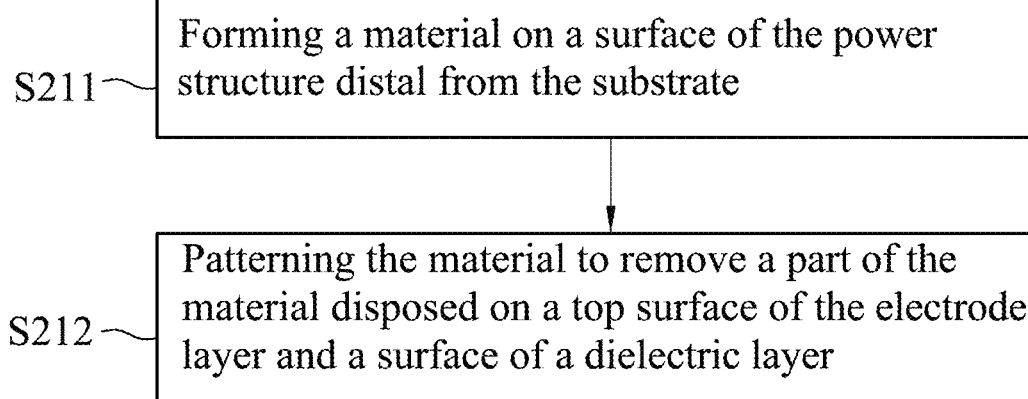
FIG. 23 is a flow diagram illustrating sub-steps of the first method for making the power device in accordance with some embodiments of the present disclosure.

In some embodiments, as shown in FIG. 23, in step S200, formation of the isolation layer 50 on the side wall 322 may be achieved by the following steps.

Figure 24:
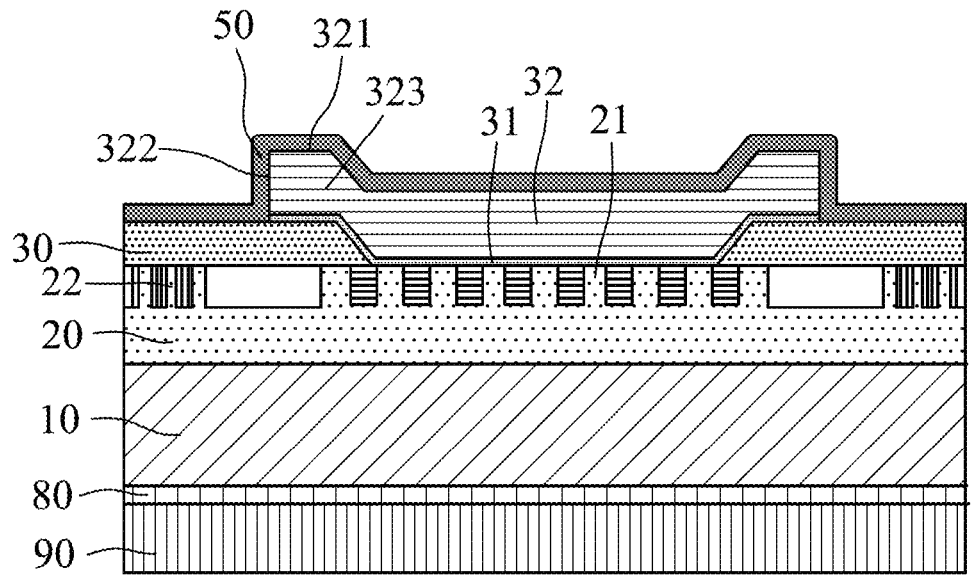
FIG. 24 is a schematic view illustrating an intermediate stage of the first method depicted in FIG. 23 in accordance with some embodiments of the present disclosure.

S211: Forming a material layer on a surface of the power structure 100s distal from the substrate 10, as shown in FIG. 24.

S212: Patterning the material layer to remove a part of the material layer disposed on the top surface 321 of the electrode layer 32 and on a surface of the dielectric layer 30, so as to form the isolation layer 50 on the side wall 322, as shown in FIG. 21. Removal of the material layer may be conducted using a photolithography process.

In some embodiments, formation of the material layer on the surface of the power structure 100s in step S211 may be performed, for example, using a deposition process or other suitable processes.

In some embodiments, after step S212, the structure of the isolation layer 50 may be similar to that shown in FIG. 21, with the isolation layer 50 covering the entirety of the side wall 322 of the electrode layer 32.

Figure 25:
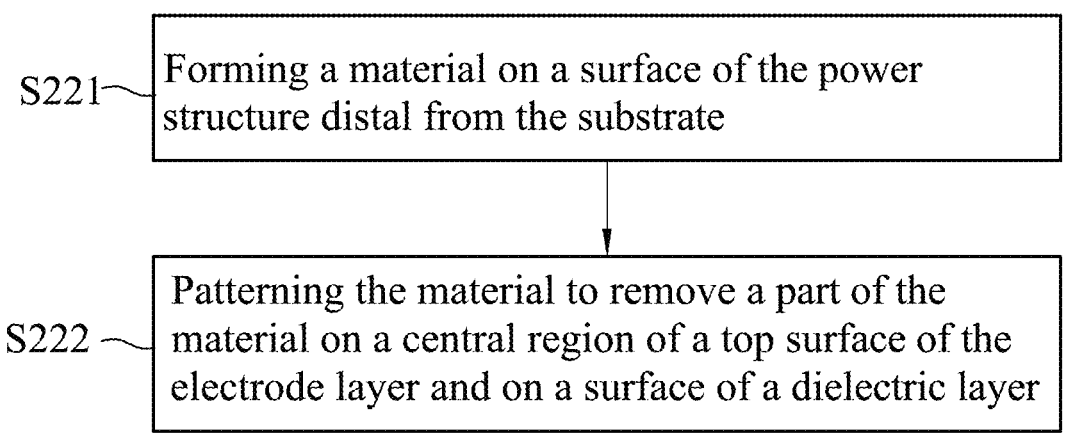
FIG. 25 is a flow diagram illustrating sub-steps of the first method for making the power device in accordance with some embodiments of the present disclosure.

Referring to FIG. 25, in step S200, formation of the isolation layer 50 on the side wall 322 may also be achieved by the following steps.

S221: Forming a material layer on a surface of the power structure 100s distal from the substrate 10, as shown in FIG. 24.

Figure 26:
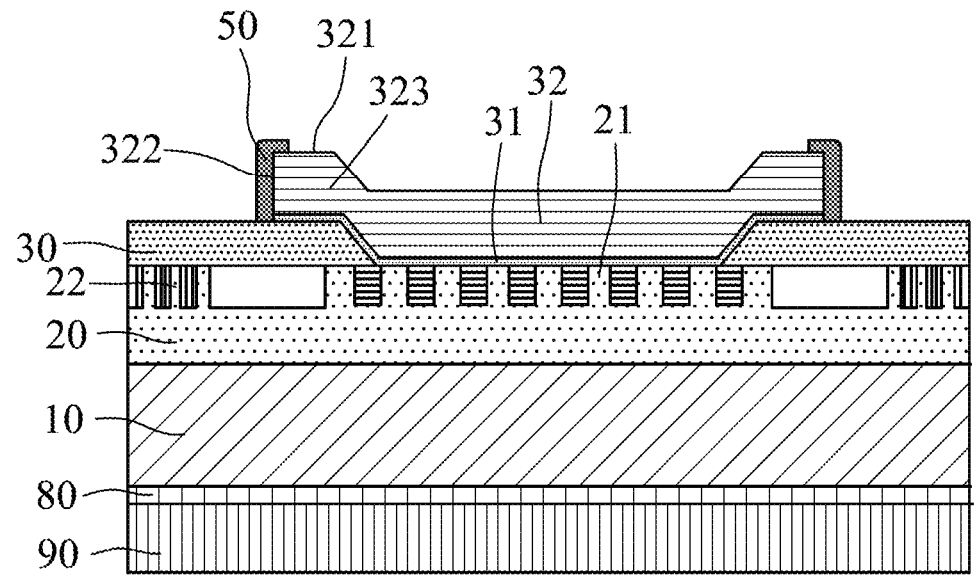
FIG. 26 is a schematic view illustrating an intermediate stage of the first method depicted in FIG. 25 in accordance with some embodiments of the present disclosure.

S222: Patterning the material layer to remove a part of the material on a central region of the top surface 321 of the electrode layer 32 and on the surface of the dielectric layer 30, so as to form the isolation layer 50 on the side wall 322 and on a periphery of the top surface 321 of the electrode layer 32 surrounding the central region, as shown in FIG. 26. Patterning of the material layer may be performed using, for example, but not limited to, a photolithography process.

In some embodiments, formation of the material layer on the surface of the power structure 100s in step S221 may be conducted using, for example, a deposition process or any other suitable process.

In some embodiments, after step S222, the isolation layer 50 may have a structure as shown in FIG. 26, with the isolation layer 50 covering the entirety of the side wall 322 and a periphery of the top surface 321 of the electrode layer 32.

In some embodiments, in step S300, the isolation layer 50 is used to completely separate the passivation layer 60 from the electrode layer 32. In some embodiments, the isolation layer 50 is used to partially separate the passivation layer 60 from the electrode layer 32. Complete or partial separation of the passivation layer 60 and the electrode layer 32 by the isolation layer 50 can be achieved by the following disclosure regarding the formation of the isolation layer 50 in step S200 and formation of the passivation layer 60 in step S300.

In some embodiments, as shown in FIG. 10, the isolation layer 50 in step S200 can be configured to extend from a periphery of the top surface 321 in a direction toward the side wall 322 and cover the side wall 322. In addition, the passivation layer 60 in step S300 can be configured to extend conformally along the isolation layer 50 from the portion of the isolation layer 50 located on the top surface 321 in a direction toward the terminal region 22. In this case, the isolation layer 50 completely separates the passivation layer 60 from the electrode layer 32.

Figure 11:
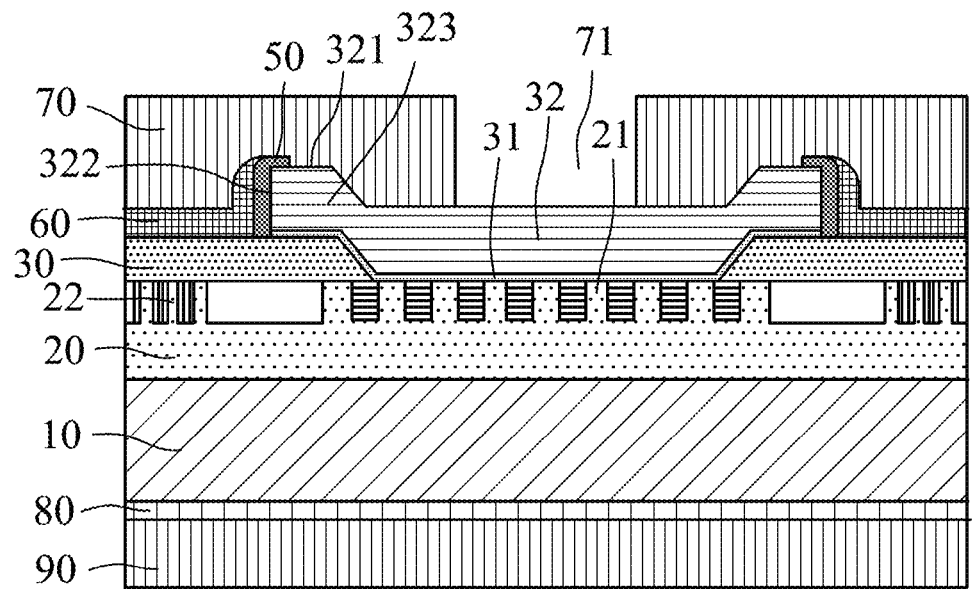
FIG. 11 is a schematic view illustrating a variation of the second embodiment of the power device in accordance with some embodiments of the present disclosure.
Figure 12:
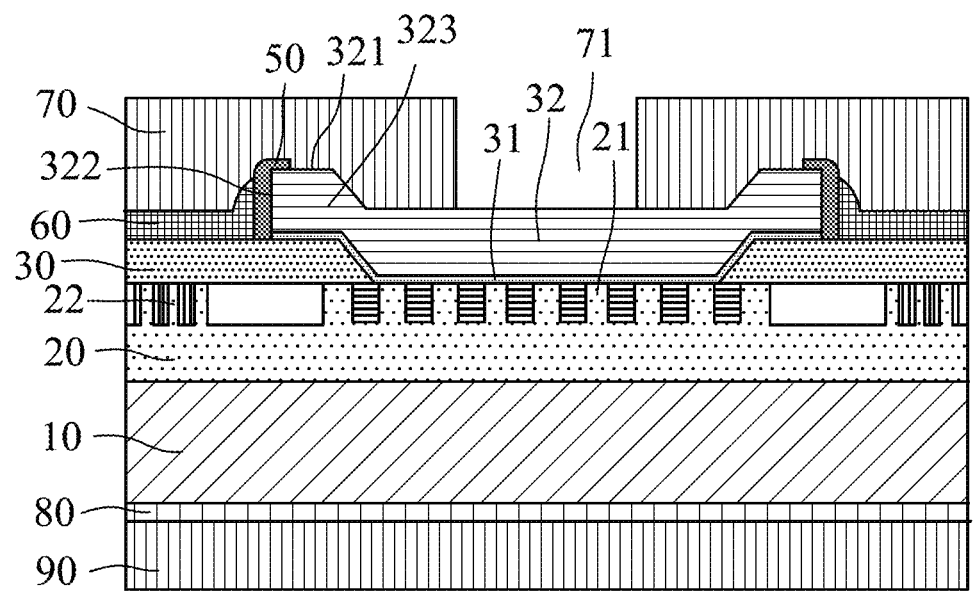
FIG. 12 is a schematic view illustrating a variation of the second embodiment of the power device in accordance with some embodiments of the present disclosure.
Figure 13:
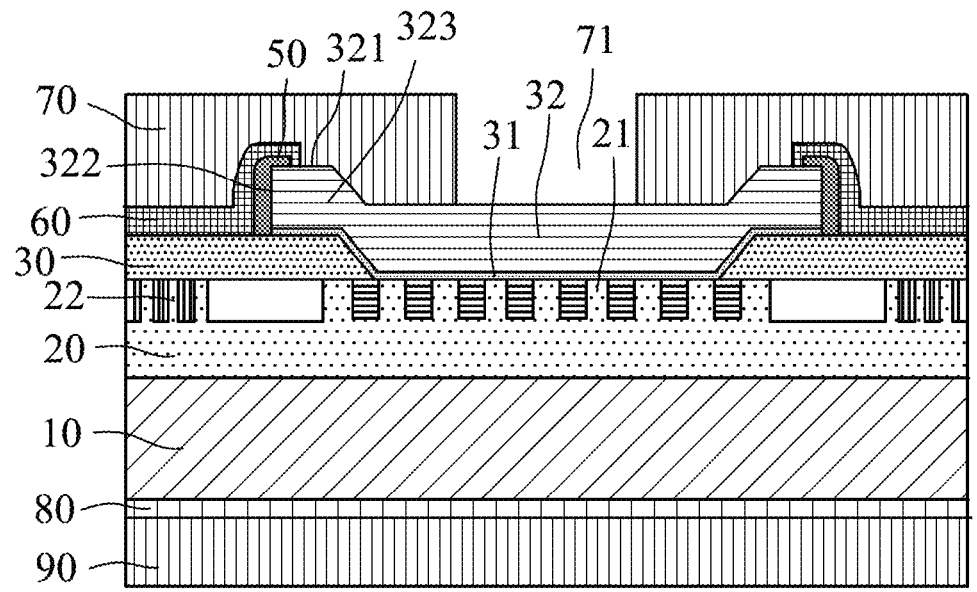
FIG. 13 is a schematic view illustrating a variation of the second embodiment of the power device in accordance with some embodiments of the present disclosure.
Figure 14:
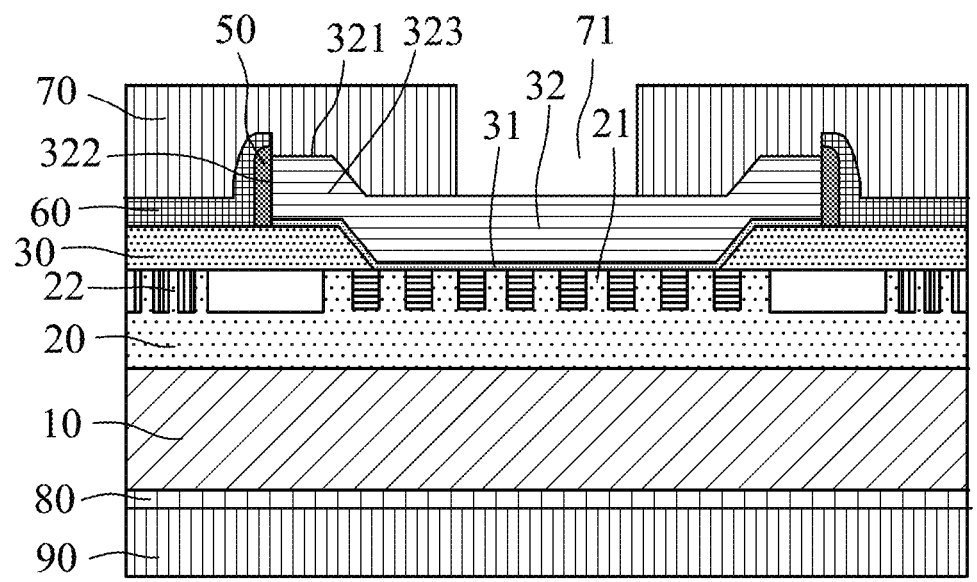
FIG. 14 is a schematic view illustrating a variation of the second embodiment of the power device in accordance with some embodiments of the present disclosure.
Figure 15:
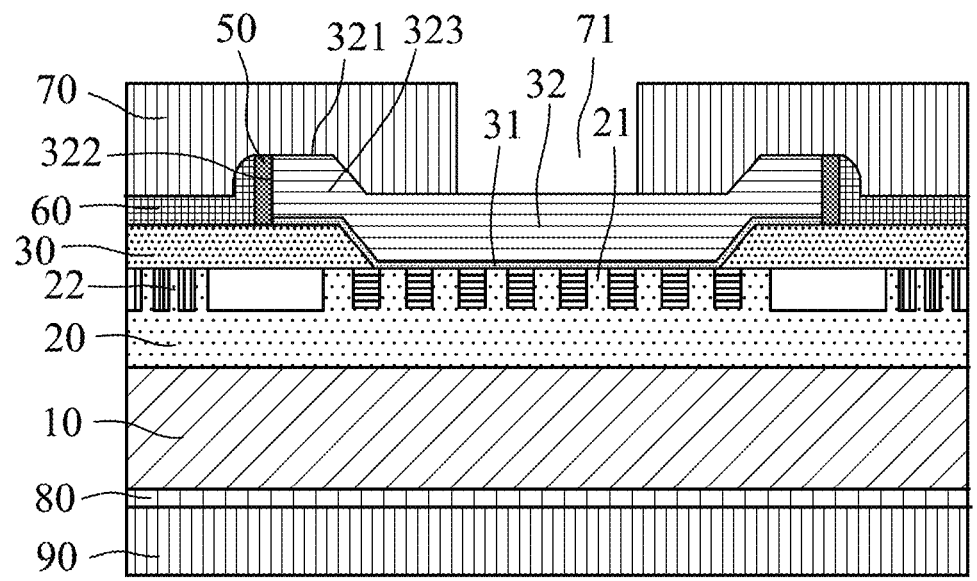
FIG. 15 is a schematic view illustrating a variation of the second embodiment of the power device in accordance with some embodiments of the present disclosure.
Figure 16:
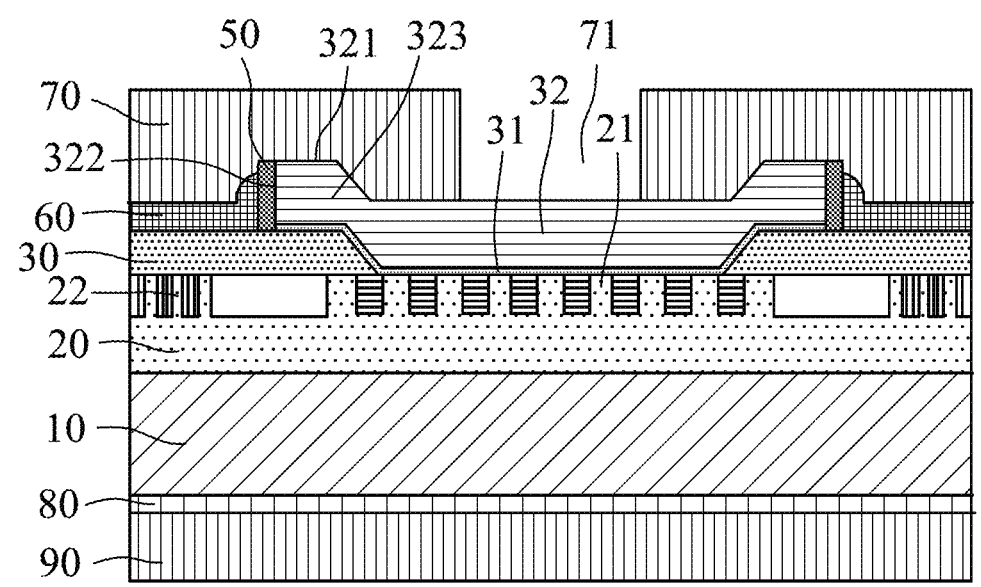
FIG. 16 is a schematic view illustrating a variation of the second embodiment of the power device in accordance with some embodiments of the present disclosure.
Figure 17:
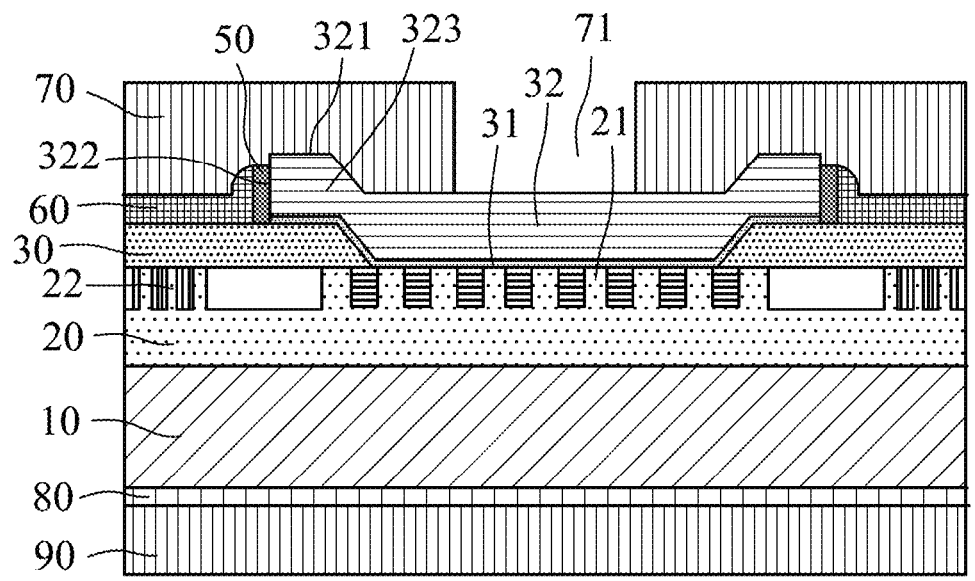
FIG. 17 is a schematic view illustrating a variation of the second embodiment of the power device in accordance with some embodiments of the present disclosure.

In some embodiments, as shown in FIG. 11, the isolation layer 50 in step S200 can be configured to extend from a periphery of the top surface 321 toward the side wall 322 and cover the side wall 322. The passivation layer 60 in step S300 is flush with a top surface of the isolation layer 50 and extends in a direction toward the terminal region 22. In this case, the isolation layer 50 also completely separates the passivation layer 60 from the electrode layer 32.

Figure 27:
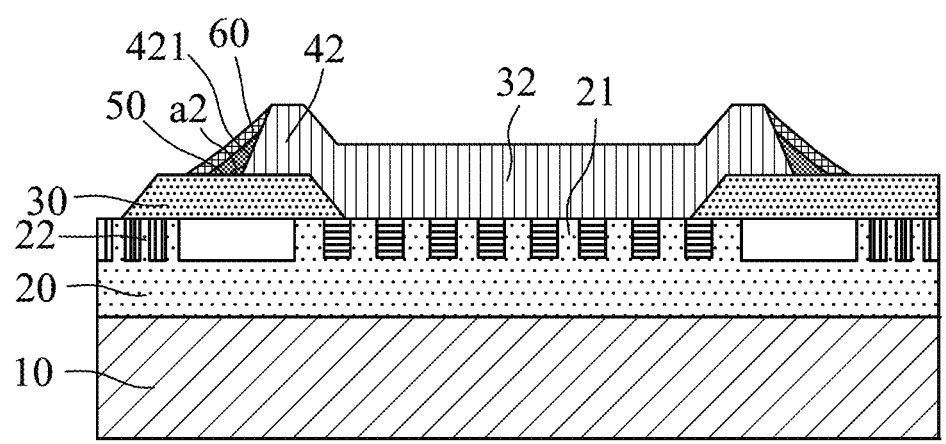
FIG. 27 is a schematic view illustrating a third embodiment of the power device in accordance with some embodiments of the present disclosure.

Referring to FIG. 27, the present disclosure provides a third embodiment of the power device 100, which is similar to the second embodiment. In the third embodiment, the power device 100 includes: the substrate 10; the drift layer 20 disposed on the substrate 10 in the laminating direction; the active region 21 and the terminal region 22 disposed in the drift layer 20 and distal from substrate 10; the dielectric layer 30 disposed on the drift layer 20 and configured to cover the terminal region 22 from a periphery of the active region 21; the electrode layer 32 which is disposed on the active region 21 in the laminating direction and which has a mesa portion 42 disposed above the dielectric layer 30, the mesa portion 42 having a side wall 421 that extends in a direction toward the dielectric layer 30, that is connected to the dielectric layer 30, and that forms a first included angle a2 with the dielectric layer 30; the Schottky contact layer 31 disposed between the active region 21 and the electrode layer 32; the isolation layer 50 which fills a corner that is defined by the side wall 421 and the dielectric layer 30 and that has the first included angle a2 so that the isolation layer 50 is formed on the electrode layer 32 and the dielectric layer 30 and has a slope surface inclinedly extending from the side wall 421 of the mesa portion 42 to the dielectric layer 30; and the passivation layer 60 disposed on the isolation layer 50. The isolation layer 50 has a thermal expansion coefficient a, the electrode layer 32 has a thermal expansion coefficient b, the passivation layer 60 has a thermal expansion coefficient c, and a>b>c.

By filling the corner defined by the side wall 421 and the dielectric layer 30 with the isolation layer 30 and by the design of the thermal expansion coefficients (i.e., a>b>c), cracking of the passivation layer 60 on the mesa portion 42 of the electrode layer 32 due to the difference in thermal expansion coefficients between the passivation layer 60 and the electrode layer 32 can be avoided when performing reliability tests such as TCT or thermal shock (TS).

It should be noted that the first included angle a2 is not limited by the present disclosure.

Figure 28:
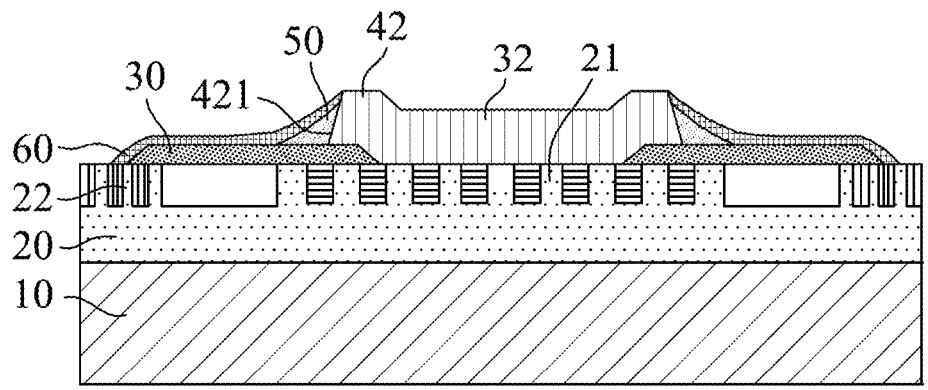
FIG. 28 is a schematic view illustrating a variation of the third embodiment of the power device in accordance with some embodiments of the present disclosure.
Figure 29:
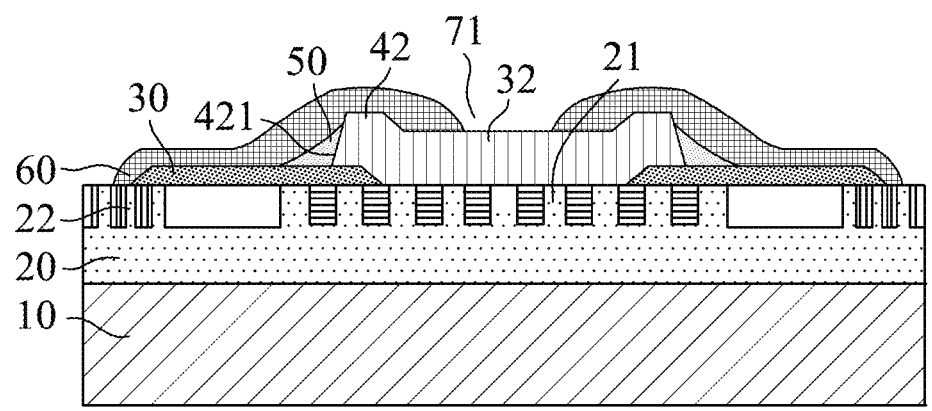
FIG. 29 is a schematic view illustrating a variation of the third embodiment of the power device in accordance with some embodiments of the present disclosure.

In some embodiments, as shown in FIGS. 27 to 29, the side wall 421 of the mesa portion 42 has a height, and the isolation layer 50 is disposed on the side wall 421 and the dielectric layer 30. The isolation layer 50 extends from the side wall 421 at more than half of the height of the side wall 421 in a direction toward the dielectric layer 30, and the passivation layer 60 at least covers the isolation layer 50. In some embodiments, as shown in FIG. 27, the passivation layer 60 covers the isolation layer 50 and a portion of the dielectric layer 30. In some embodiments, as shown in FIG. 28, the passivation layer 60 covers the isolation layer 50 and the surface of the dielectric layer 30 that is uncovered by the isolation layer 50 and the electrode layer 32. In some embodiments, as shown in FIG. 29, the passivation layer 60 extends from a periphery of the welding region 71 of the electrode layer 32 in a direction along the slope surface of the isolation layer 50 toward the dielectric layer 30 and covers the surface of the dielectric layer 30 that is uncovered by the isolation layer 50 and the electrode layer 32. As mentioned above, in the direction from the side wall 421 of the mesa portion 42 of the electrode layer 32 toward the dielectric layer 30, the isolation layer 50 has the slope surface that extends away from the side wall 421.

Figure 30:
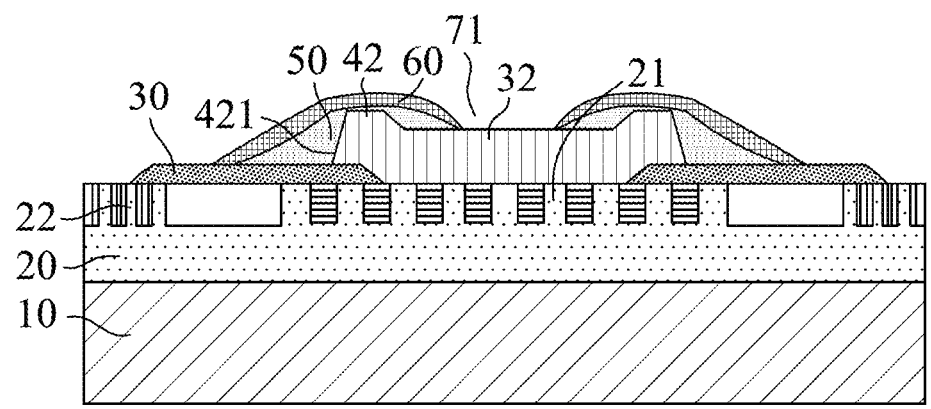
FIG. 30 is a schematic view illustrating a variation of the third embodiment of the power device in accordance with some embodiments of the present disclosure.
Figure 31:
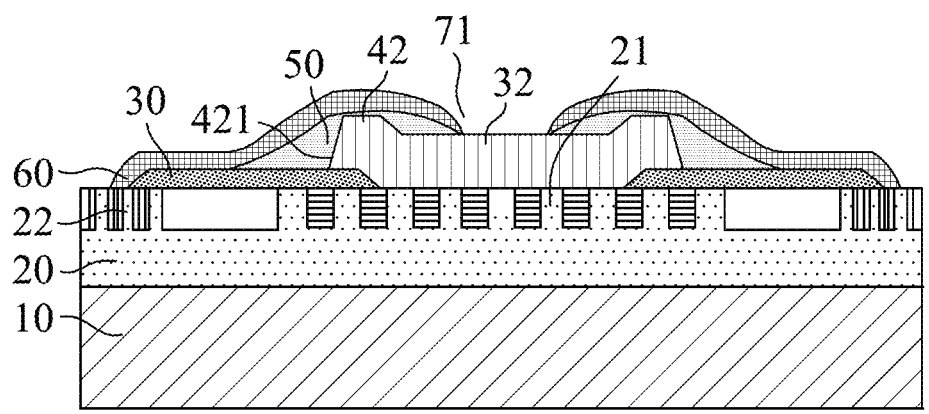
FIG. 31 is a schematic view illustrating a variation of the third embodiment of the power device in accordance with some embodiments of the present disclosure.
Figure 32:
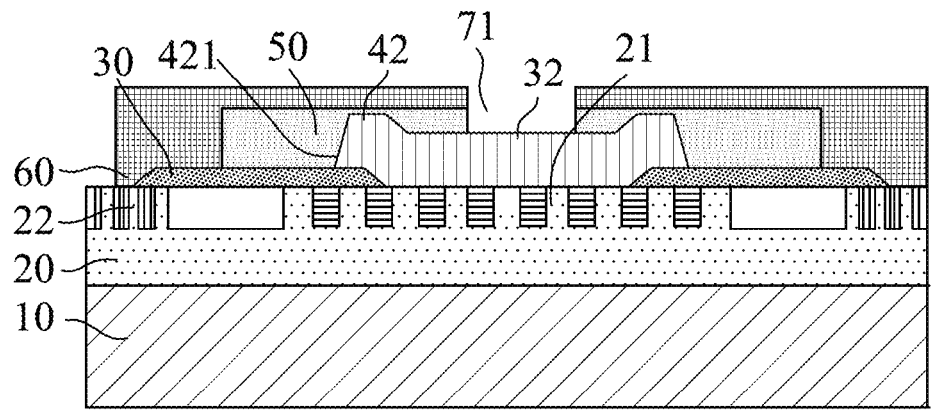
FIG. 32 is a schematic view illustrating a variation of the third embodiment of the power device in accordance with some embodiments of the present disclosure.

In some embodiments, as shown in FIGS. 30 and 31, the top surface of the electrode layer 32 distal from the drift layer 20 has the welding region 71 for electrical connection, the isolation layer 50 extends from a periphery of the welding region 71 along the side wall 421 of the mesa portion 42 toward the dielectric layer 30, and covers a portion of the surface of the dielectric layer 30, and the passivation layer 60 covers the isolation layer 50. In an alternative embodiment, the isolation layer 50 extends from a periphery of the top surface of the electrode layer 32 along the side wall 421 of the mesa portion 42 toward the dielectric layer 30, and the passivation layer 60 covers the isolation layer 50. In addition, in a direction from the side wall 421 of the mesa portion 42 of the electrode layer 32 toward the dielectric layer 30, the isolation layer 50 has a slope surface that extends away from the side wall 421. In some embodiments, the isolation layer 50 may be configured not to have a slope surface. Exemplarily, in some embodiments, the passivation layer 60 covers the isolation layer 50 and a portion of the dielectric layer 30, as shown in FIG. 30. In some embodiments, as shown in FIG. 31, the passivation layer 60 covers the surface of the isolation layer 50 and the surface of the dielectric layer 30 that is uncovered by isolation layer 50 and the electrode layer 32. In some other embodiments, as shown in FIG. 32, the isolation layer 50 may extend in a direction parallel to a top surface of the drift layer 20.

Figure 33:
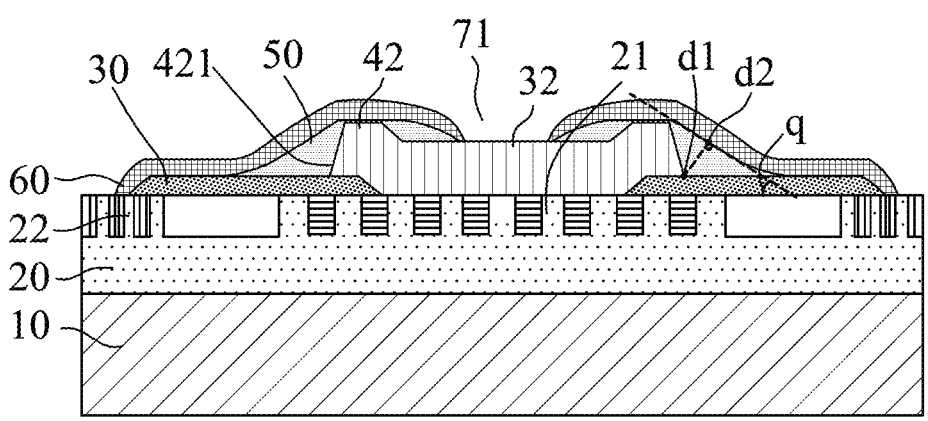
FIG. 33 is a schematic view illustrating a variation of the third embodiment of the power device in accordance with some embodiments of the present disclosure.
Figure 34:
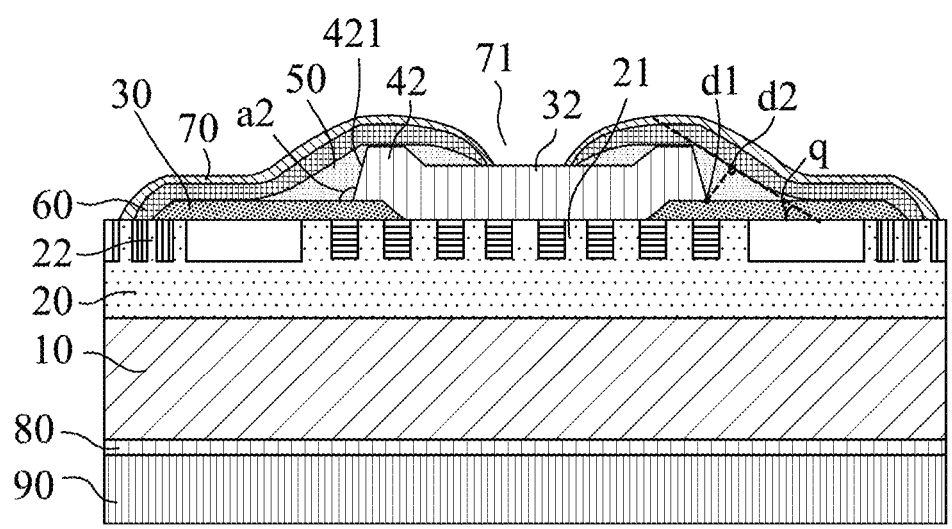
FIG. 34 is a schematic view illustrating a variation of the third embodiment of the power device in accordance with some embodiments of the present disclosure.

In some embodiments, as shown in FIGS. 33 and 34, in a direction from the side wall 421 of the mesa portion 42 of the electrode layer 32 toward the dielectric layer 30, the isolation layer 50 has a slope surface that extends away from the side wall 421. In a cross section of the power device 100 cutting along the laminating direction, (i) the dielectric layer 30 and the side wall 421 of the mesa portion 42 has a contact point d1, (ii) the slope surface has a selected point d2 that is nearest to the contact point d1, and (iii) a tangent line which passes through the selected point d2 and which extends in the direction from the side wall 421 of the mesa portion 42 of the electrode layer 32 toward the dielectric layer 30 forms a second included angle q with a top surface of the drift layer 20, the second included angle q ranging from about 30° to about 45°. For example, the second included angle q may be 30°, 40°, or 45°, but not limited thereto. This enables a smoother transition of the isolation layer 50 (from the electrode layer 32 to the dielectric layer 30) by limiting the second included angle q between about 30° and about 45° when the isolation layer 50 has a slope surface, which in turn prevents cracking of the passivation layer 60.

In some embodiments, as shown in FIG. 34, the third embodiment of the power device 100 of the present disclosure further includes the protection layer 70 covering the passivation layer 60 and the electrode layer 32. In some embodiments, the protection layer 70 may be etched to expose a portion of the electrode layer 32, thereby forming the through hole and the welding region 71 exposed from the through hole (as shown in FIG. 34).

In some embodiments, as shown in FIG. 34, the third embodiment of the power device 100 of the present disclosure may further include the ohmic contact layer 80 disposed on a side of the substrate 10 distal from the drift layer 20, a metal layer 90 disposed on a side of the ohmic contact layer 50 distal from the substrate 10. In some embodiments, the isolation layer 50 fills the corner defined by the side wall 421 and the dielectric layer 30 and having the first included angle a2, and the passivation layer 60 is disposed on the isolation layer 50. Examples regarding the isolation layer 50 filling the corner defined by the side wall 421 and the dielectric layer 30 and having the first included angle a2 will be described below.

The present disclosure provides a fourth embodiment of the power device 100. The fourth embodiment is similar to the third embodiment, and includes the substrate 10, the drift layer 20 on the substrate 10, the active region 21 disposed in the drift layer 20 distal from the substrate 10, the dielectric layer 30 disposed on the drift layer 20 and extending from a periphery of the active region 21 and away from the active region 21, the Schottky contact layer 31, the electrode layer 32 having the mesa portion 42 disposed on the dielectric layer 30, the isolation layer 50 disposed on the electrode layer 32 and the dielectric layer 30, and the passivation layer 60 disposed on the isolation layer 50. The relationship among the thermal expansion coefficients in the fourth embodiment is the same as that of the aforesaid embodiments, i.e., a>b>c.

By providing the isolation layer 50 in the corner where the side wall 421 of the mesa portion 42 of the electrode layer 32 meets the dielectric layer 30 and by the design of the thermal expansion coefficients (i.e., a>b>c), cracking of the passivation layer 60 on the mesa portion 42 of the electrode layer 32 due to the difference in thermal expansion coefficients between the passivation layer 60 and the electrode layer 32 can be avoided when performing reliability tests such as TCT or TS.

The present disclosure provides a fifth embodiment of the power device 100. The fifth embodiment is similar to the fourth embodiment, and includes the substrate 10, the drift layer 20 on the substrate 10, the active region 21 disposed in the drift layer 20 distal from the substrate 10, the dielectric layer 30 disposed on the drift layer 20 and extending from a periphery of the active region 21 and away from the active region 21, the Schottky contact layer 31 disposed between the electrode layer 32 and the active region 21, the electrode layer 32 having the mesa portion 42 disposed on the dielectric layer 30, the isolation layer 50 disposed on the electrode layer 32 and the dielectric layer 30, and the passivation layer 60 disposed on the isolation layer 50. The mesa portion 42 extends above the dielectric layer 30 and has a side wall 421 that connects to and extends away from the dielectric layer 30 and that forms the first included angle a2 with the dielectric layer 30. The electrode layer 32 has the welding region 71 for electrical connection, the welding region 71 being located at a surface of the electrode layer 32 opposite to the drift layer 20. The isolation layer 50 is disposed on the electrode layer 32 and the dielectric layer 30, and is configured so that an inclined angle of the isolation layer 50 extending from a periphery of the welding region 71 toward the dielectric layer 30 is smaller than the first included angle a2. The relationship among the thermal expansion coefficients in the fifth embodiment is the same as that of the aforesaid embodiments, i.e., a>b>c.

The present disclosure makes it possible to extend the isolation layer 50 from a periphery of the welding region 71 in a direction toward the dielectric layer 30 and to cover a portion of the dielectric layer 30 at an inclined angle smaller than the first included angle a2. In addition, by the design of the thermal expansion coefficients (i.e., a>b>c), cracking of the passivation layer 60 on the mesa portion 42 of the electrode layer 32 due to the difference in thermal expansion coefficients between the passivation layer 60 and the electrode layer 32 can be avoided when performing reliability tests such as TCT or TS.

Figure 35:
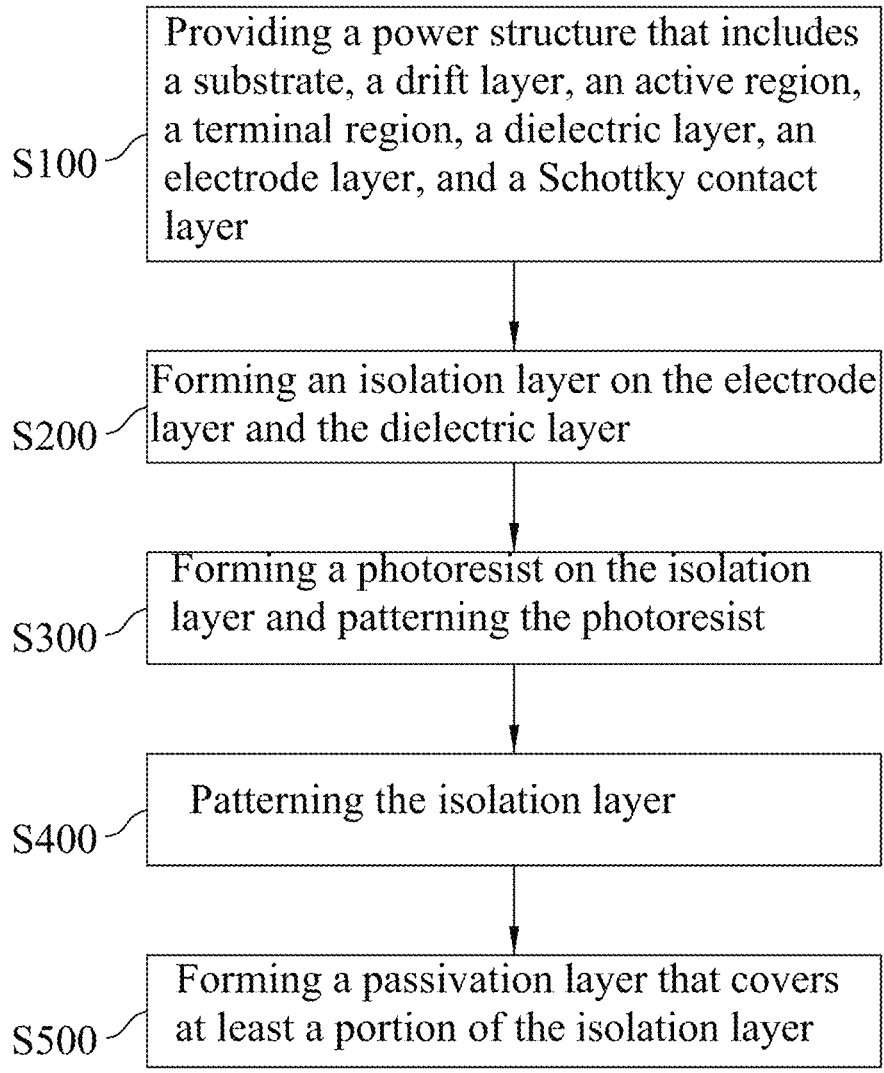
FIG. 35 is a flow diagram illustrating a second method for making the power device in accordance with some embodiments of the present disclosure.

Referring to FIG. 35, the present disclosure provides a second method for preparing the power device 100 (e.g., the third embodiment of the present disclosure), which includes the following steps.

Figure 36:
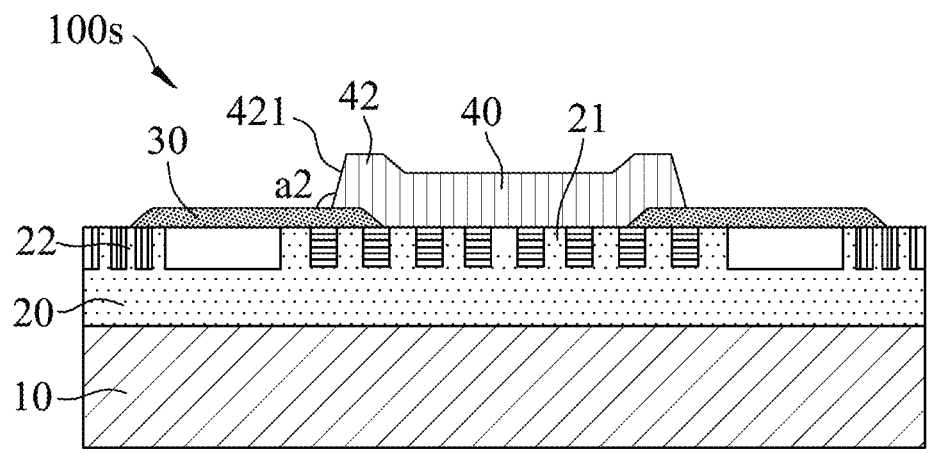
FIGS. 36 to 40 are schematic views illustrating intermediate stages of the second method depicted in FIG. 35 in accordance with some embodiments.

S100: Providing a power structure 100s. The power structure 100s includes: the substrate 10, the drift layer 20 disposed on the substrate 10, the active region 21 and the terminal region 22 disposed in the drift layer 20 and distal from the substrate 10, the dielectric layer 30 covering the terminal region 22 and a periphery of the active region 21, the electrode layer 32 disposed on the active region 21, and the Schottky contact layer 31 disposed between the electrode layer 32 and the active region 21. The electrode layer 32 includes the mesa portion 42 which extends above the dielectric layer 30, and the mesa portion 42 has the top surface distal from the drift layer 20 and the side wall 421 proximate to the dielectric layer 30. The side wall 421 of the mesa portion 42 is connected to the dielectric layer 30 and forms the first included angle a2 with the dielectric layer 30 (see FIG. 36).

S200: Forming the isolation layer 50 on the electrode layer 32 and the dielectric layer 30. The isolation layer 50 has a first portion covering a central region of the electrode layer on the active region 21, and a second portion covering the side wall 421 of the mesa portion 42 and a part of the dielectric layer 30. The second portion of the isolation layer 50 has a slope surface extending in a direction from the side wall 421 of the mesa portion 42 toward the dielectric layer 30 and away from the side wall 421 (see FIG. 37).

S300: Forming a photoresist 92 on the isolation layer 50 and patterning the photoresist 92 so as to form a through hole 921 in the photoresist 92 that exposes the first portion of the isolation layer 50 disposed on the central region of the electrode layer 32 (see FIG. 38).

S400: Removing the first portion of the isolation layer exposed from the through hole 921 (see FIG. 39) by a photolithography process.

Figure 40:
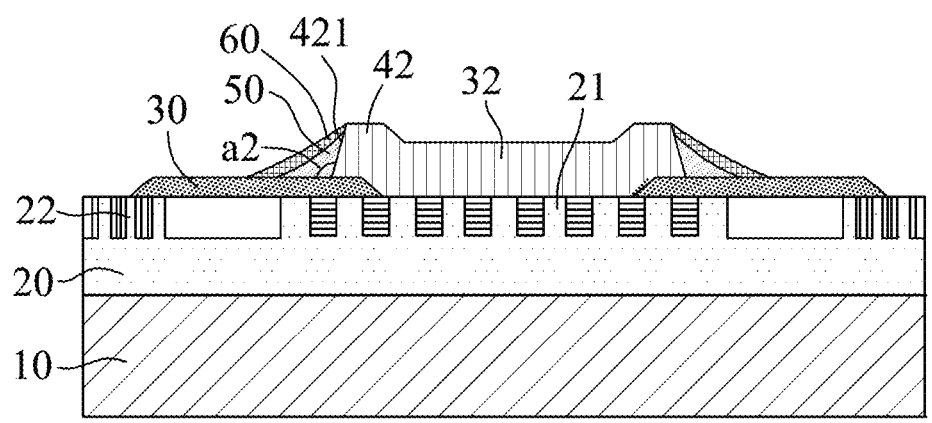

S500: Forming the passivation layer 60 that covers at least a portion of the isolation layer 50, the passivation layer 60 and the electrode layer 32 being at least partially separated by the isolation layer 50 (see FIG. 40). The isolation layer 50 has a thermal expansion coefficient a, the electrode layer has a thermal expansion coefficient b, the passivation layer 60 has a thermal expansion coefficient c, and a>b>c.

Figure 37:
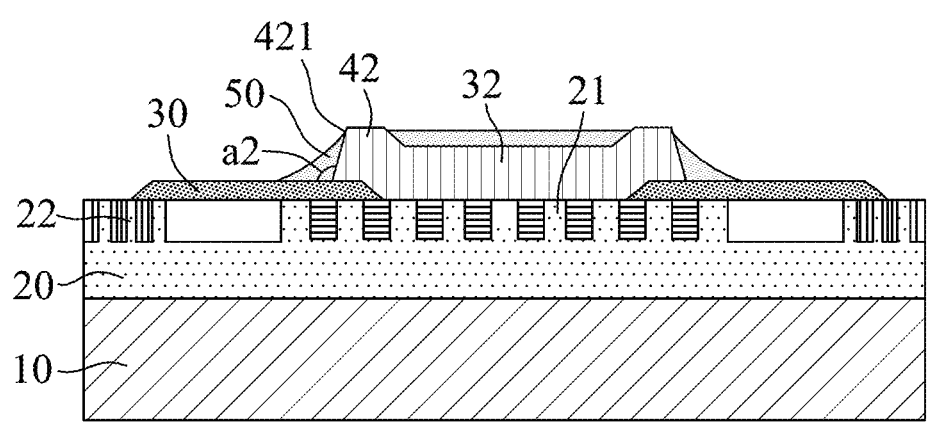

Referring to FIG. 37, in some embodiments, the slope surface of the isolation layer 50 extending in the direction from the side wall 421 of the mesa portion 42 toward the dielectric layer 30 and away from the side wall 421 may be obtained by planarizing the isolation layer 50. Planarization of the isolation layer 50 may be performed by, for example, but not limited to, mechanical grinding or chemical etching. Other processes suitable for planarizing the isolation layer 50 are within the contemplated scope of the present disclosure. In some embodiments, after forming the isolation layer 50 (step S200), the isolation layer 50 may be baked and cured. The parameters for baking and curing the isolation layer 50, such as baking/curing temperature and humidity, can be tuned by a person skilled in the art according to the practical requirements and are not limited to the present disclosure.

Figure 38:
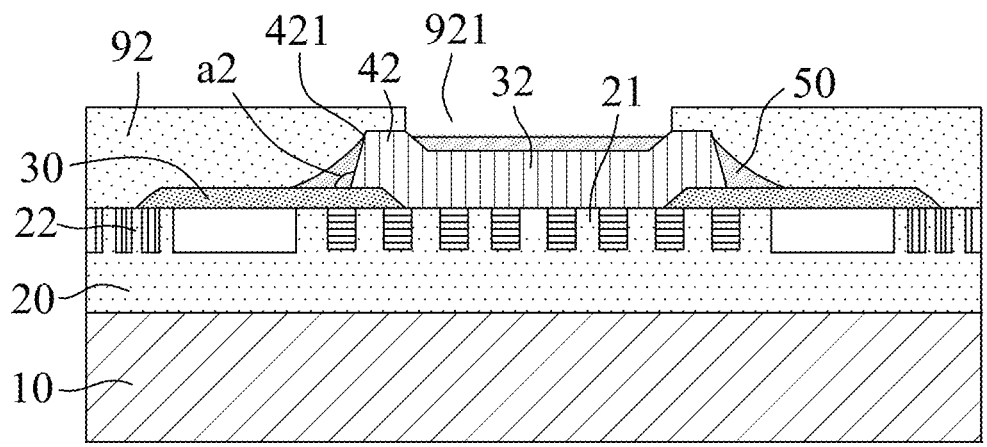

In some embodiments, in step S300 of the second method, the through hole 921 formed in the photoresist 92 may expose the first portion of the isolation layer 50 disposed on the central region of the electrode layer 32 (as shown in FIG. 38). In some embodiments, the size of the through hole 921 may be determined by a person skilled in the art depending on the size of the central region of the electrode layer 32 that needs to be exposed.

Figure 39:
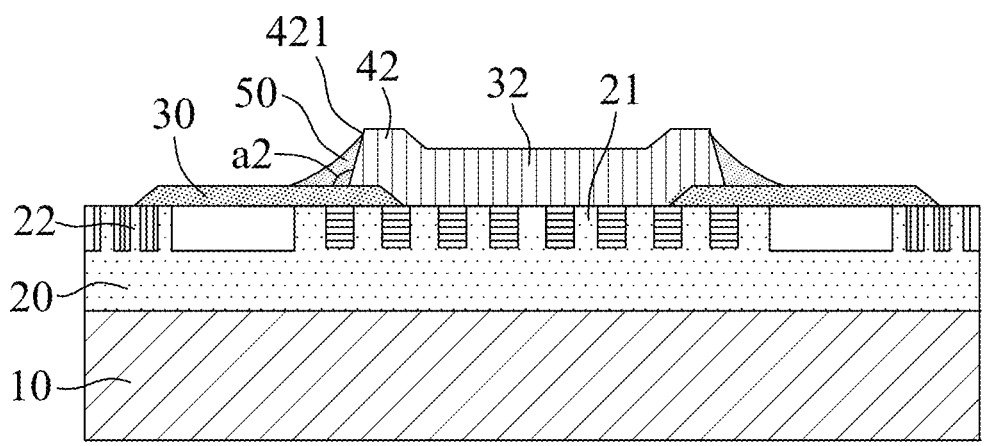

In some embodiments, in step S400 of the second method, the isolation layer 50 disposed on the electrode layer 32 and the dielectric layer 30 is obtained after removing the first portion of the isolation layer 50 on the central region of the electrode layer 32 (as shown in FIG. 39).

In some embodiments, forming the passivation layer 60 on the isolation layer 50 may be performed, for example, but not limited to, epitaxial growth procedure or chemical vapor deposition.

In some embodiments, after step S500 of the second method, the second method may further include a step of subjecting the passivation layer 60 to a photolithography process to obtain the passivation layer 60 that covers at least the isolation layer 50.

Figure 41:
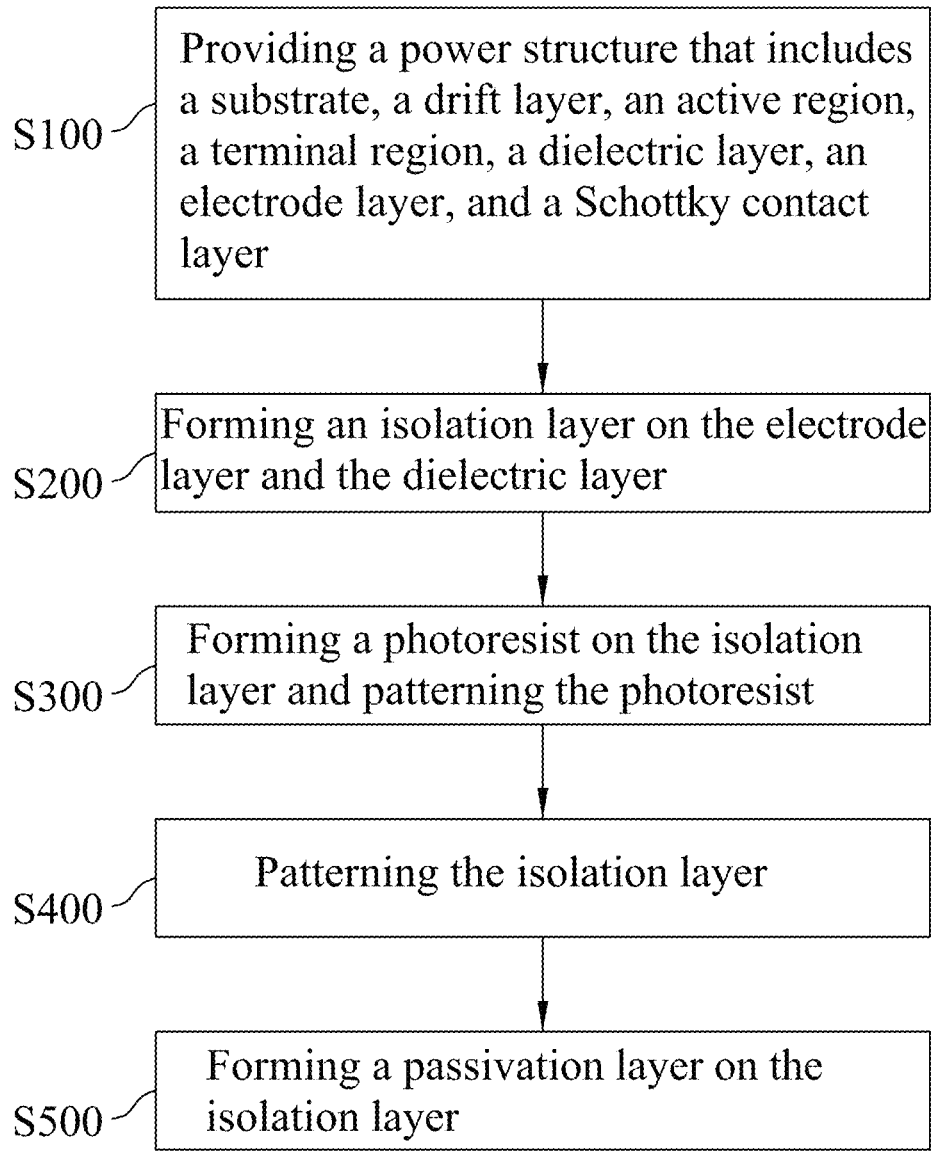
FIG. 41 is a flow diagram illustrating a third method for making the power device in accordance with some embodiments of the present disclosure.

Referring to FIG. 41, the present disclosure provides a third method for preparing the power device 100, which includes the following steps.

S100: Providing a power structure 100s. The power structure 100s includes: the substrate 10, the drift layer 20 disposed on the substrate 10, the active region 21 and the terminal region 22 disposed in the drift layer 20 and distal from the substrate 10, the dielectric layer 30 covering the terminal region 22 and a periphery of the active region 21, the electrode layer 32 disposed on the active region 21, and the Schottky contact layer 31 disposed between the electrode layer 32 and the active region 21. The electrode layer 32 has the mesa portion 42, and the mesa portion 42 has the top surface 321 distal from the drift layer 20 and the side wall 421 proximate to the dielectric layer 30. The side wall 421 of the mesa portion 42 is connected to the dielectric layer 30 and forms the first included angle a2 with the dielectric layer 30 (see FIG. 42).

Figure 42:
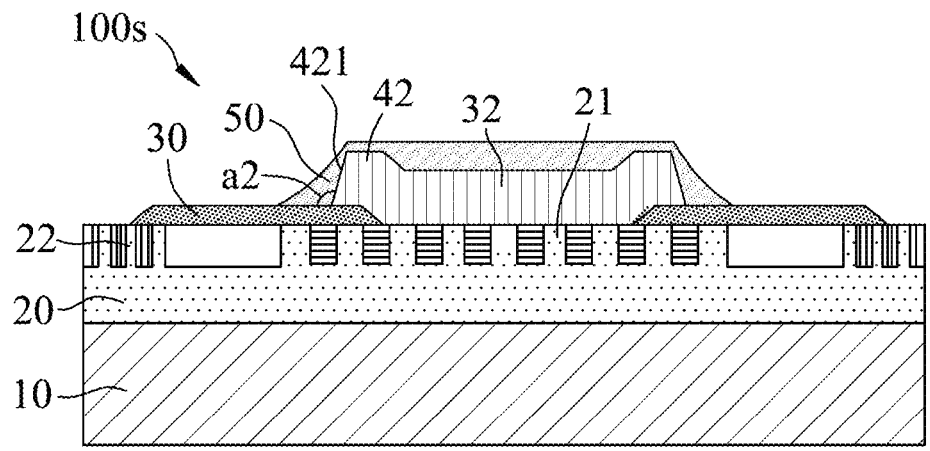
FIGS. 42 to 43 are schematic views illustrating intermediate stages of the third method depicted in FIG. 41 in accordance with some embodiments.

S200: Forming the isolation layer 50 on the electrode layer 32 and the dielectric layer 30. The isolation layer 50 has a first portion covering top of the electrode layer 32, and a second portion covering the side wall 421 of the mesa portion 42 and a part of the dielectric layer 30. The second portion of the isolation layer 50 has a slope surface extending in a direction from the side wall 421 of the mesa portion 42 toward the dielectric layer 30 and away from the side wall 421 (see FIG. 42). In FIG. 42, the electrode layer 32 is completely covered by the isolation layer 50.

Figure 43:
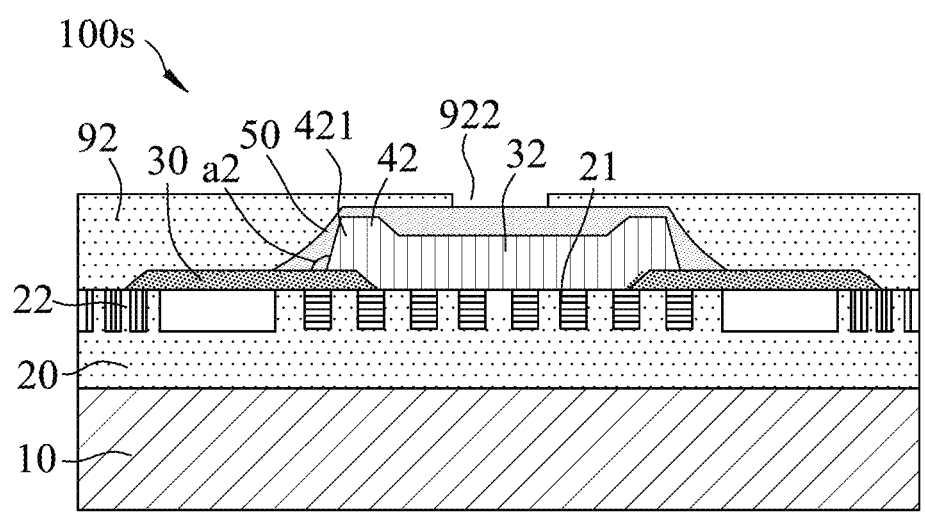

S300: Forming a photoresist 92 on the isolation layer 50 and patterning the photoresist 92 so as to form a through hole 922 in the photoresist 92 that exposes the first portion of the isolation layer 50 disposed on the central region of the electrode layer (see FIG. 43).

S400: Patterning the isolation layer 50 to remove the first portion of the isolation layer 50 exposed from the through hole 922 by a photolithography process.

S500: Forming the passivation layer 60 on the isolation layer 50. The isolation layer 50 has a thermal expansion coefficient a, the electrode layer has a thermal expansion coefficient b, the passivation layer 60 has a thermal expansion coefficient c, and a>b>c.

Referring to FIG. 42, in some embodiments, the slope surface of the isolation layer 50 extending in the direction from the side wall 421 of the mesa portion 42 toward the dielectric layer 30 and away from the side wall 421 may be obtained by planarizing the isolation layer 50. Planarization of the isolation layer 50 may be performed by, for example, but not limited to, mechanical grinding or chemical etching. Other processes suitable for planarizing the isolation layer 50 are within the contemplated scope of the present disclosure. In some embodiments, after forming the isolation layer 50 (step S200 of the third method), the isolation layer 50 may be baked and cured. The parameters for baking and curing the isolation layer 50, such as baking/curing temperature and humidity, can be tuned by a person skilled in the art according to the practical requirements and are not limited to the present disclosure.

In some embodiments, in step S300 of the third method, the size of the through hole may be determined by a person skilled in the art depending on the size of the welding region 71 that needs to be exposed, and is not limited to the present disclosure.

In some embodiments, in step S400 of the third method, removing a part of the first portion of the isolation layer 50 from the welding region 71 of the electrode layer 32.

In some embodiments, after step S500 of the third method, the third method may further include the step of subjecting the passivation layer 60 to a photolithography process to obtain a passivation layer 60 covering at least the isolation layer 50.

Figure 44:
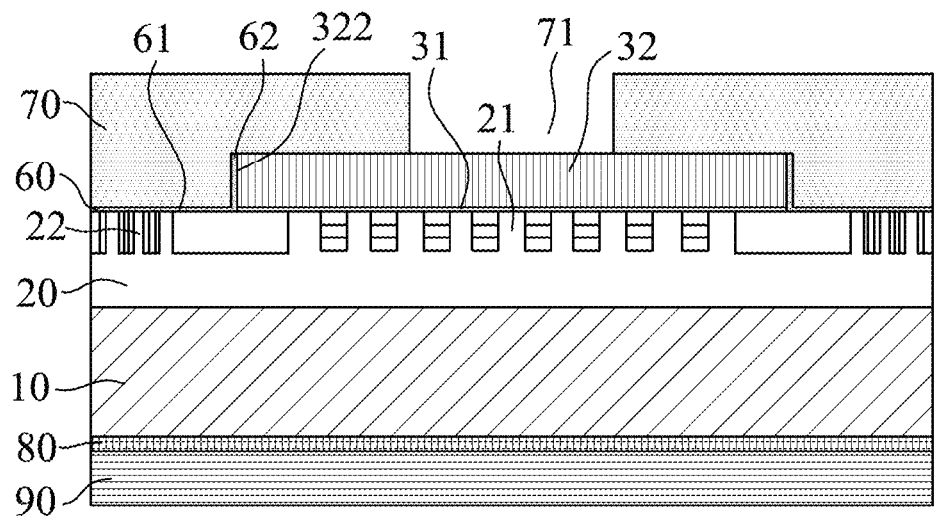
FIG. 44 is a schematic view illustrating a passivation structure for the power device in accordance with some embodiments of the present disclosure.

Referring to FIG. 44, a passivation structure is provided for power devices (e.g., silicon carbide power devices) that includes the substrate 10, the drift layer 20 disposed on the substrate 10, and the Schottky contact layer 31 and the electrode layer 32 formed sequentially on the drift layer 20. The passivation structure includes a passivation layer 60 that is disposed on the drift layer 20 and that has a thickness of not greater than about 0.1 μm. The passivation layer 60 includes a first portion 61 disposed on the drift layer 20 and a second portion 62 that is connected to the first portion 61 and that wraps at least a part of the side wall 322 of the electrode layer 32. The passivation structure can effectively prevent the passivation layer 60 from cracking after the power device 100 is tested by TCT, thereby preventing the device to become less reliable or even fail.

The drift layer 20 is disposed on the substrate 10. In some embodiments, the drift layer 20 may be disposed on the substrate 10 by, for example, a vapor-phase epitaxial growth method. It is noted that the active region 21 and the terminal region 22 surrounding the active region 21 are disposed in the drift layer 20.

The Schottky contact layer 31 may be formed on the drift layer 20 by, for example, but not limited to, vapor deposition or sputtering. In some embodiments, the Schottky contact layer 31 is disposed on the active region 21.

It should be understood that the thicknesses of the electrode layer 32 and the Schottky contact layer 31 in the present disclosure are only examples and other examples are within the contemplated scope of the present disclosure.

The first portion 61 is disposed on the drift layer 20 (i.e., on the terminal region 22 of the drift layer 20), and the second portion 62 wraps the side wall 322 of the electrode layer 32. In other words, the first portion 61 of the passivation layer covers the terminal region 22 and the second portion 62 covers the side wall 322 of the electrode layer 32.

In this regard, the abovementioned second portion may wrap a part of the side wall 322 of the electrode layer 32 or may wrap an entirety of the side wall 322 of the electrode layer 32.

In some embodiments, the passivation layer 60 has a thickness of not greater than about 0.1 µm. For example, the thickness of the passivation layer 60 may be 0.03 µm, 0.05 µm, 0.07 µm, 0.08 µm, or 0.1 µm, but not limited thereto.

It should be noted that the thickness of the passivation layer 60 not greater than about 0.1 µm means that the thicknesses of both the first portion 61 and the second portion 62 of the passivation layer are not greater than about 0.1 µm (i.e., the thickness of the first portion 61 covering the terminal region 22 and the thickness of the second portion 62 covering the side wall 322 of the electrode layer 32 are both not greater than about 0.1 µm).

By reducing the thickness of the passivation layer 60, cracks caused by different thermal expansion coefficients of different materials when using the power device 100 (or during TCT testing) can be effectively avoided, which can prevent water vapor and/or ions from entering the power device 100 and prevent the power device 100 from failure caused y cracking.

In summary, the passivation structure can effectively prevent the cracking of the electrode layer 32 and cracking of the passivation layer 60 during TCT of the passivation layer 60. In addition, since there may be no contact between the top surface 322 of the electrode layer 32 and the passivation layer 60, the passivation layer 60 will not crack when being subjected to stress during TCT. That is, by not forming the passivation layer 60 above the electrode layer 32 (i.e., the frontal electrode), the thermal expansion of the metal (i.e., the electrode layer 32) during TCT which squeezes the passivation layer 60 on the top of the e electrode layer 32 can be prevented, thereby effectively eliminating the cracking of the passivation layer 60 and the cracking of the electrode layer 32. Without cracking of the passivation layer 60 and cracking of the electrode layer 32, external ions or other contaminants can be prevented from entering into the power device 100, which reduces electrical performance failure and device failure. In addition, the passivation layer 60 has the thickness of not greater than 0.1 µm (i.e., to be deemed a thin medium), which increases the throughput of the power device 100, production capacity, reduces manufacturing costs, and prevents the electrode layer 32 from cracking while shielding against external interference.

To further ensure the effectiveness of the passivation layer 60, the thickness of the passivation layer 60 should be not less than about 0.02 µm and not greater than about 0.1 µm. That is, the thickness of the passivation layer 60 may range between 0.02 µm and 0.1 µm.

Figure 52:
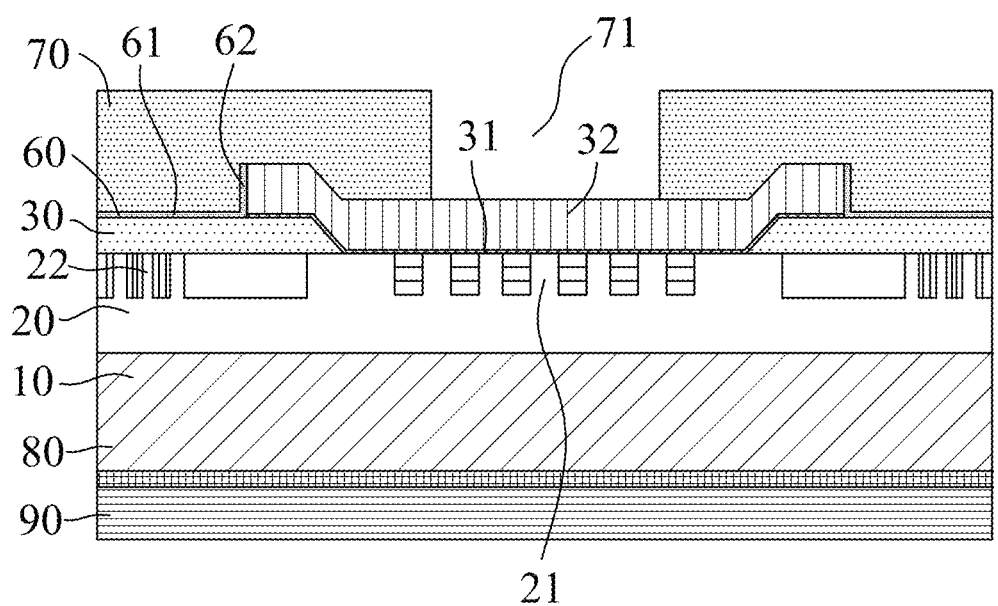

Referring to FIG. 52, the passivation structure may further include the dielectric layer 30 disposed between the drift layer 20 and the first portion 61 of the passivation layer 60, and the protection layer covering the passivation layer 60 and the electrode layer 32.

In this embodiment, the dielectric layer 30 is disposed between the first portion 61 of the passivation layer 60 and the drift layer 20, and a side wall and a part of an upper surface of the dielectric layer 30 (e.g., silicon oxide epitaxial layer) is adjacent to and contacts the Schottky contact layer 31.

In this embodiment, the dielectric layer 30 is formed before forming the Schottky contact layer 31 (i.e., the dielectric layer 30 should be deposited first). The dielectric layer 30 is etched to form a through hole therein, and then the Schottky contact layer 31 is deposited in the through hole of the dielectric layer 30. In this way, the dielectric layer 30, as shown in FIG. 52, located between the first portion 61 and the terminal region 22 and adjacent to a part of a lower surface of the Schottky contact layer 31 can be obtained.

In some embodiments, the second portion 62 of the passivation layer 60 may wrap at least half of the side wall 322 of the electrode layer 32.

That is, a distance between an end surface of the second portion 62 distal from the substrate 10 and a lower surface of the first portion 61 is not less than half the thickness of the electrode layer 32.

In other embodiments, the end surface of the second portion 62 of the passivation layer 60 is flush with the top surface of the electrode layer 32 distal from the drift layer 20.

In some embodiments, the passivation layer 60 includes at least one of a silicon oxide layer and a silicon nitride layer. The combination of silicon oxide and silicon nitride refers to a double-layered structure including a silicon oxide layer and a silicon nitride layer.

It should be noted that the passivation structure of the present disclosure can be applied to silicon carbide power devices, for example, it can be applied to power diodes, power MOSFET devices, etc. In the following, power diodes will be used as an example for illustration.

The present disclosure provides a sixth embodiment of the power device 100. In this embodiment, the power device 100 is a silicon carbide power device. The sixth embodiment is similar to the second embodiment, and includes the substrate 10, the drift layer 20 on the substrate 10, the active region 21 disposed in the drift layer 20 distal from the substrate 10, the dielectric layer 30 disposed on the drift layer 20 and extending from a periphery of the active region 21 and away from the active region 21, the Schottky contact layer 31 disposed on the active region 21, the passivation layer 60 disposed on the terminal region 22 and adjacent to the Schottky contact layer 31, and the protection layer 70 which covers the passivation layer 60 and the electrode layer 32, the protection layer 70 having a through hole that exposes the welding region 71 of the electrode layer 32. The sixth embodiment of the power device 100 further includes the ohmic contact layer 80 and the metal layer 90 formed on a side of the substrate 10 distal from the drift layer 20. The passivation layer 60 has a thickness that is not greater than about 0.1 µm, and the passivation layer 60 includes the first portion 61 covering the terminal region 22 and the second portion 62 that is connected with the first portion 61 and that covers at least a portion of the side wall 322 of the electrode layer 32.

The sixth embodiment of the power device 100 includes the previously mentioned passivation structure, and the components of the passivation structure is omitted for the sake of brevity.

In some embodiments, the protection layer 70 is made from poly-p-phenylenebenzobisoxazole (PBC)), polyimide, benzocyclobutene (BCB), or combinations thereof.

In this embodiment, the through hole is formed in the protection layer 70 to expose a welding region of the electrode layer 50 for electrical connection. To be specific, the size of the through hole may be determined by a person skilled in the art, and is not limited by the present disclosure.

Since the sixth embodiment of the power device 100 includes the previously mentioned passivation structure, the structure of the passivation structure should be included in the power device 100 if it does not contradict with the structure and function of other components of the power device. To avoid repetition, the components of the passivation structure and its corresponding effects are not repeated hereinafter.

Figure 53:
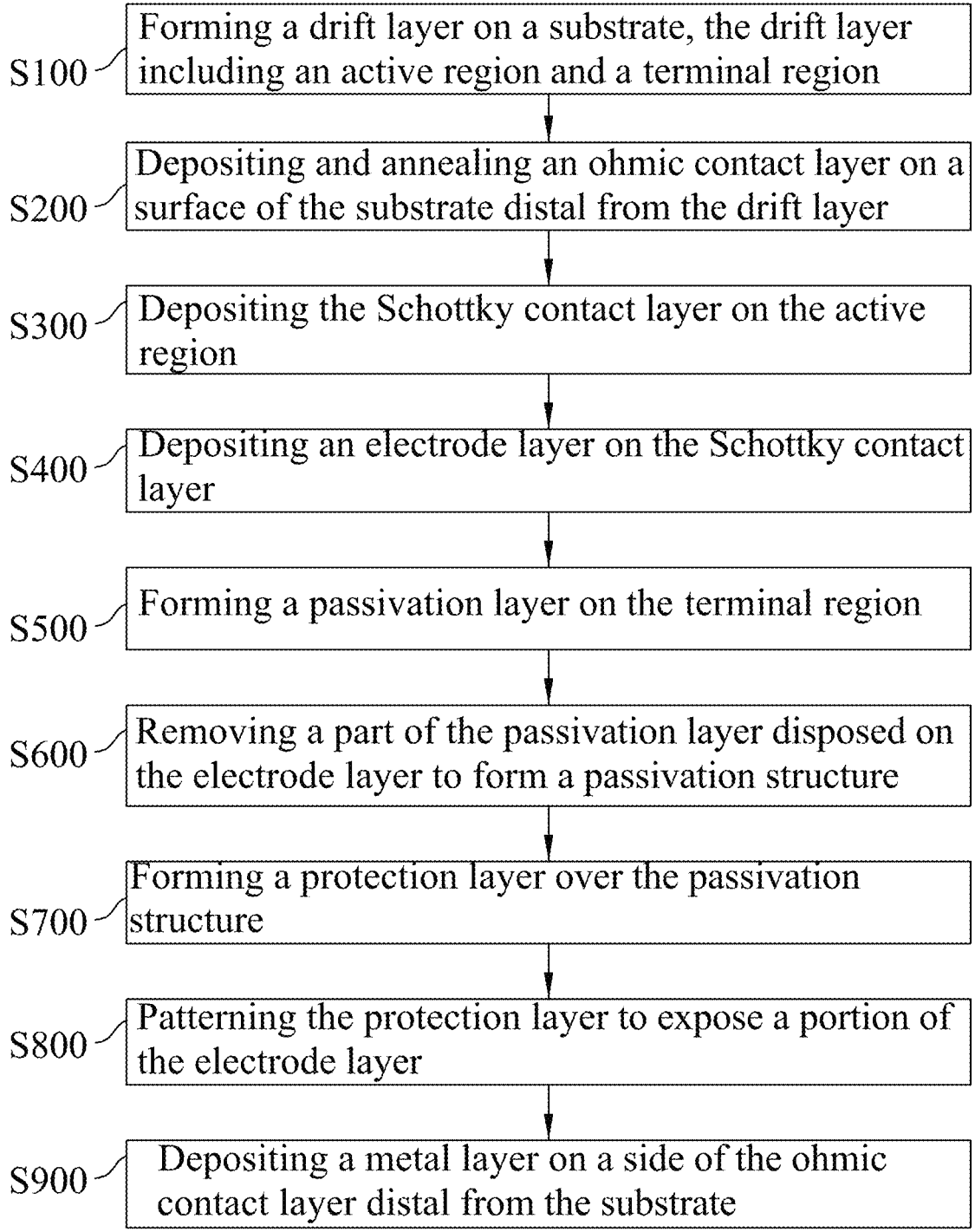
FIG. 53 is a flow diagram illustrating the fourth method for making the power device in accordance with some embodiments of the present disclosure.

Referring to FIG. 53, the present disclosure provides a fourth method for preparing the sixth embodiment of the power device 100, which includes the following steps.

Figure 45:
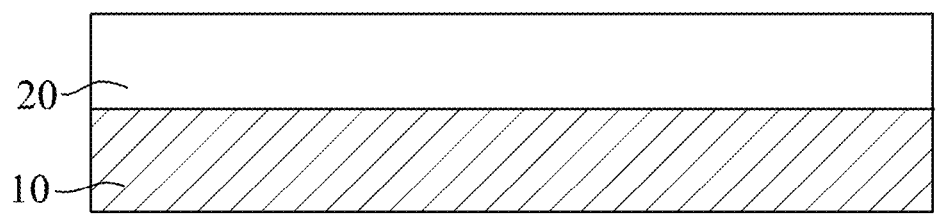
FIGS. 45 to 52 are schematic views illustrating intermediate stages of a fourth method for making the power device in accordance with some embodiments.

S100: Forming the drift layer 20 on the substrate 10, and the drift layer 20 includes the active region 21 and the terminal region 22 surrounding the active region 21, as shown in FIG. 45.

The drift layer 20 may be grown by a vapor phase epitaxial growth method, and the drift layer 20 may have a thickness that ranges from about 5 µm to about 80 µm, and a doping concentration ranging from about $1 \times 10^{14}/cm^3$ to about $5 \times 10^{16}/cm^3$.

Before performing step S100 of the fourth method, the substrate 10 may be subjected to an RCA (Radio Corporation of America) standard cleaning process to remove contaminants from the substrate 10.

Figure 46:
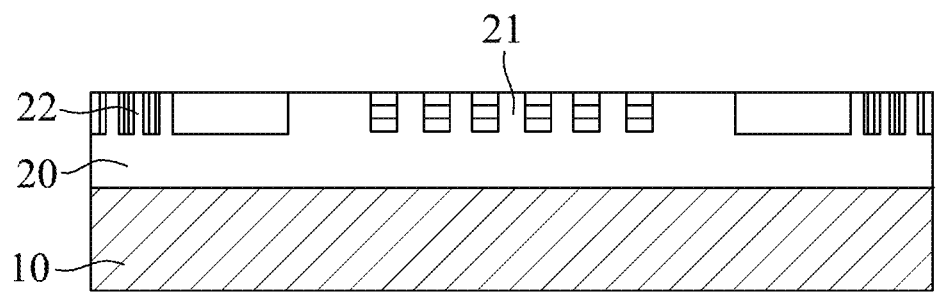

Formation of the active region 21 and the terminal region 22 in the drift layer 20 may be carried out by the following sub-steps: (i) depositing a protective film on the drift layer 20 using physical vapor deposition (PVD) or chemical vapor deposition (CVD), (ii) etching the protective film to expose to-be-implanted region of the drift layer 20, (iii) performing ion implantation in the to-be-implanted region of the drift layer 20, and (iv) activating implanted ions at high temperature to form the terminal region 22 and the active region 21, as shown in FIG. 46. The active region 21 may be square-shaped, bar-shaped, hexagonal-shaped, or combinations thereof.

Figure 47:
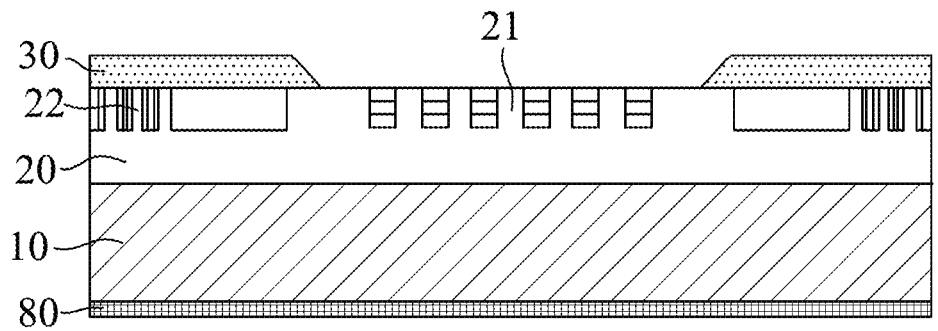

S200: Depositing and annealing the ohmic contact layer 80 on a surface of the substrate 10 distal from the drift layer 20, as shown in FIG. 47.

Step S200 of the fourth method may include the following sub-steps: (i) forming a protection layer on an upper surface of the drift layer 20 distal from the substrate 10, (ii) forming the ohmic contact layer 80 on a side of the substrate 10 distal from the drift layer 20 by vapor deposition or sputtering, (iv) annealing the ohmic contact layer 80, and (v) removing the protection layer.

The annealing temperature in the annealing step ranges from about 900° C. to about 1200° C., and the annealing time ranges from about 60 seconds to about 180 seconds.

The ohmic contact layer 80 may include any one of Ni, Ti, Nb, and Mo, and may have a thickness that ranges between about 100 nm and about 500 nm.

S300: Depositing the Schottky contact layer 31 on the active region 21.

In certain embodiments, prior to performing step S300 of the fourth method, the fourth method may optionally include: depositing the dielectric layer 30 on the upper surface of the drift layer 20 distal from the substrate 10; and etching the dielectric layer 30 to expose the active region 21, as shown in FIG. 47.

The Schottky contact layer 31 may be formed by vapor deposition or sputtering, followed by an annealing process.

For annealing the Schottky contact layer 31, the annealing temperature may range between about 300° C. and about 500° C., and the annealing time may range between about 60 seconds and 300 seconds. The Schottky contact layer 31 may include one or any combinations of metals such as Ti, W, Ta, Ni, Mo, and Pt, and have a thickness that may range between about 100 nm and about 500 nm.

S400: Depositing the electrode layer 32 on the Schottky contact layer 31, as shown in FIG. 48.

The electrode layer 32 may be formed by vapor deposition or sputtering, and the electrode layer 32 may include one or any combinations of metals such as Al, Ag, Cu, and Au, but not limited there. The electrode layer 32 may have a thickness that ranges between about 2 µm and about 5 µm.

S500: Forming the passivation layer 60 on the terminal region 22, the passivation layer 60 covering the electrode layer 32, and having a thickness of not greater than about 0.1 µm.

Figure 48:
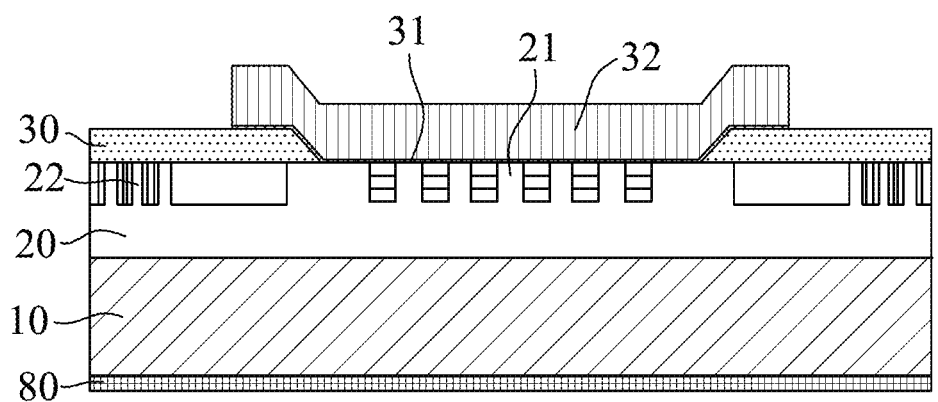
Figure 49:
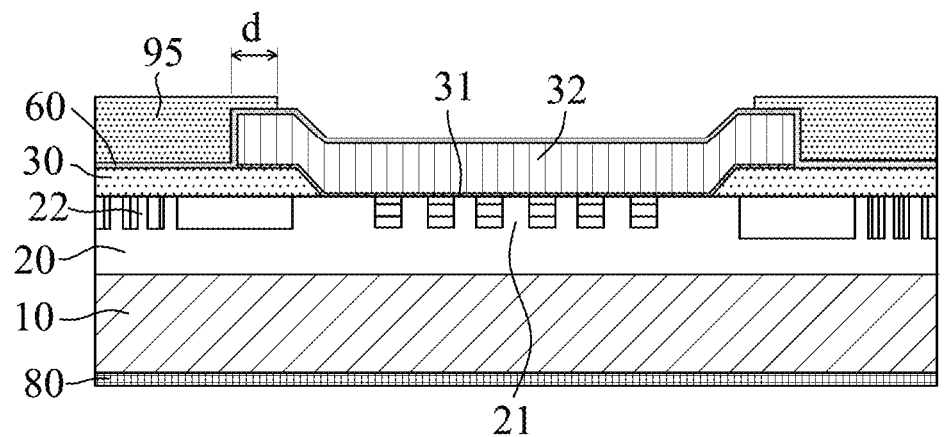

That is, as shown in FIG. 49, the passivation layer 60 is formed on an entire surface of the power structure shown in FIG. 48 distal from the substrate 10, and the thickness of the passivation layer 60 is controlled to be not greater than about 0.1 µm.

To further ensure the effectiveness of the passivation layer 60, the thickness of the passivation layer 60 may be not less than about 0.02 µm and not greater than about 0.1 µm. That is, the thickness of the passivation layer 60 ranges between about 0.02 µm and about 0.1 µm.

S600: Removing a part of the passivation layer 60 disposed on the electrode layer 32 by an etching process to form a passivation structure, the passivation structure including the first portion 61 covering the terminal region 22 and the second portion 62 that is connected to the first portion 61 and that covers at least a portion of the side wall 322 of the electrode layer 32.

S700: Forming the protection layer 70 over the passivation structure and the electrode layer 32 so that the protection layer 70 fully covers the passivation structure and the electrode layer 32.

Description regarding the material and the thickness of the protection layer 70 may be referred to the foregoing description, and is omitted herein for the sake of brevity.

Figure 51:
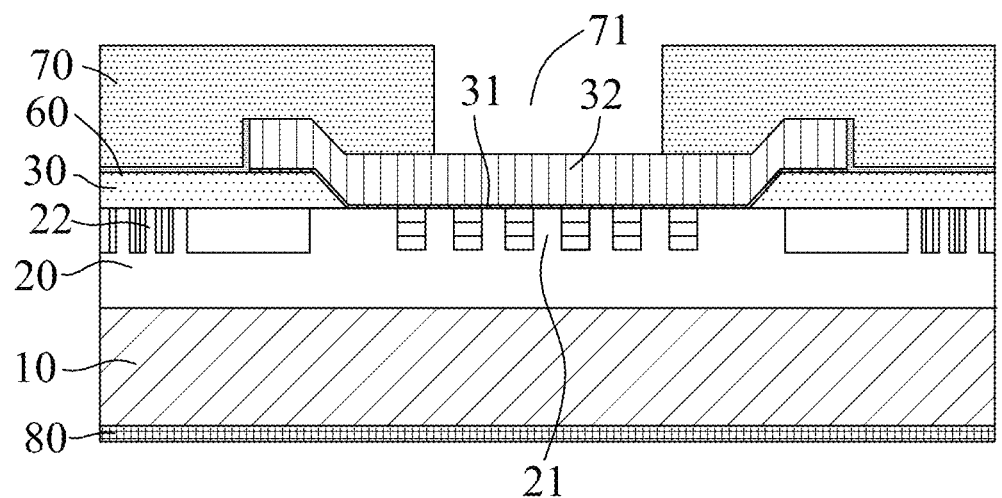

S800: Patterning the protection layer 70 by an etching process to expose a portion of the electrode layer 32 (i.e., the welding region 71 of the electrode layer 32), as shown in FIG. 51. The location of the welding region 71 can be selected by a person skilled in the art.

S900: Depositing a metal layer 90 on a side of the ohmic contact layer 90 distal from the substrate 10, as shown in FIG. 52.

The metal layer 90 may be formed by vapor deposition or sputtering, and the thickness of the metal layer 90 may range between about 2 µm and about 5 µm.

It should be noted that the present method for preparing silicon carbide power devices is intended to prepare the power diodes mentioned in the preceding text, and thus, relevant description regarding the power diodes will not be repeated for the sake of brevity.

Figure 54:
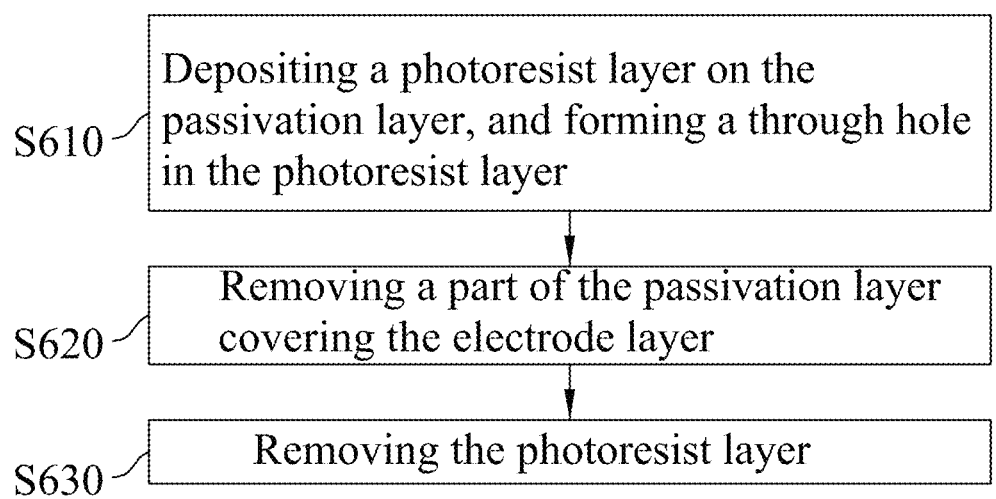
FIG. 54 is a flow diagram illustrating sub-steps of the fourth method for making the power device in accordance with some embodiments of the present disclosure.

Referring to FIG. 54, the step S600 of the fourth method may further include the following sub-steps.

S610: Forming a photoresist layer 95 on the passivation layer 60. The photoresist layer 95 is then patterned to form a through hole in the photoresist layer 95 by a photolithography process to expose a portion of passivation layer 60. A portion of the photoresist layer 95 covers the passivation layer 60 on an edge portion of the electrode layer 32. The edge portion of the electrode layer 32 covered by the passivation layer 60 and the patterned photoresist layer has a width (d) that ranges between about 2 μm and about 20 μm (see FIG. 49).

In this case, the photoresist layer 95 being etched to expose a part of the passivation layer 60 and to cover the edge portion of the electrode layer 32 may facilitate the formation of the passivation layer 60 that is flush or substantially flush with the top surface of the electrode layer 32 after the passivation layer 60 is dry etched.

Figure 50:
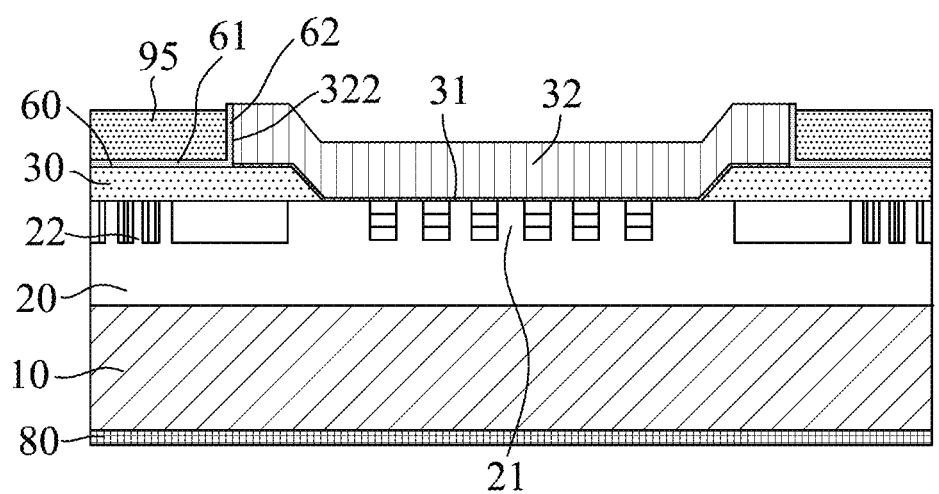

S620: Removing a part of the passivation layer 60 covering the electrode layer 32 by a dry etching process, as shown in FIG. 50.

It should be noted that a reaction gas for the dry etching process in S620 contains fluorine, and the fluoro group from the fluorine-containing reaction gas reacts with the passivation layer 60, which in turn etches the passivation layer 60. During this process, since the photoresist layer 95 contains carbon and oxygen elements, the photoresist layer 95 may partially react with the fluoro group during the dry etching process, which in turn causes the passivation layer 60 around a periphery of the electrode layer 32 to be etched off.

The etching parameters may be controlled to obtain the passivation layer 60 that covers at least a part of the side wall 322 of the electrode layer 32. For example, the etching time can be increased to obtain the second portion 62 that has half the thickness of the electrode layer 32, or the etching time can be reduced to obtain the second portion 62 that is flush with the top surface of the electrode layer 32.

S630: Removing the photoresist layer 95.

That is, after performing step S620, the photoresist layer 95 is removed. The removal of the photoresist layer 95 may be performed using a technique chosen by a person skilled in the art, but not limited thereto.

The above text only provides optional embodiments of the present disclosure, and is not intended to limit the present disclosure. The disclosure may include various modifications and variations. Any modification, equivalent replacement, improvement, etc. made within the spirit and principles of this disclosure shall be included in the scope of this disclosure.

It should also be noted that each specific technical feature described in the above embodiments can be combined in any suitable way without contradiction. In order to avoid unnecessary repetition, the present disclosure will not be described separately for various possible combinations.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A power device, comprising:
   a substrate;
   a drift layer disposed on said substrate;
   a terminal region and an active region disposed in said drift layer, said terminal region surrounding said active region;
   an electrode layer disposed on said active region;
   a Schottky contact layer disposed between said electrode layer and said active region;
   a passivation layer disposed on said drift layer; and
   an isolation layer disposed between said passivation layer and said electrode layer so that said passivation layer and said electrode layer are at least partially separated from each other,
   wherein said isolation layer has a thermal expansion coefficient a, said electrode layer has a thermal expansion coefficient b, said passivation layer has a thermal expansion coefficient c, and a>b>c.

2. The power device of claim 1, wherein said passivation layer and said electrode layer are completely separated by said isolation layer.

3. The power device of claim 2, wherein said electrode layer has a side wall, and said isolation layer is disposed on said side wall.

4. The power device of claim 3, wherein said side wall has a height, and said isolation layer extends from said side wall at more than half of said height of said side wall in a direction toward said drift layer.

5. The power device of claim 4, wherein:
   said isolation layer is flush with a top surface of said electrode layer, and extends toward said drift layer; and
   said passivation layer completely covers said isolation layer and extends toward said terminal region.

6. The power device of claim 2, further comprising a dielectric layer disposed on said drift layer and extends from a periphery of said active region to cover said terminal region;
   said electrode layer has a mesa portion that extends above said dielectric layer;
   said mesa portion has a side wall contacting and extending away from said dielectric layer; and
   said passivation layer covers said isolation layer and extends toward said terminal region.

7. The power device of claim 6, wherein said isolation layer is disposed on said side wall of said mesa portion.

8. The power device of claim 7, wherein said side wall has a height, and said isolation layer extends from said side wall at more than half of said height of said side wall in a direction toward said drift layer.

9. The power device of claim 8, wherein:
said electrode layer has a top surface distal from said drift layer;
said side wall is proximate to said terminal region;
said isolation layer is flush with a top surface of said electrode layer and extends from said electrode layer in a direction toward said drift layer;
said passivation layer completely covers said isolation layer and extends in a direction toward said terminal region; and
said electrode layer and said passivation layer are separated by said isolation layer.

10. The power device of claim 2, further comprising a dielectric layer which is disposed on said drift layer and which extends from a periphery of said active region along a direction away from said active region,
wherein
said active region is disposed in said drift layer distal from said substrate,
said electrode layer has a mesa portion that extends above and contacts with said dielectric layer,
said isolation layer is disposed on and convers said electrode layer and said dielectric layer, and
said passivation layer is disposed on said isolation layer.

11. The power device of claim 10, wherein:
said mesa portion of said electrode layer has a height measured from said dielectric layer;
said isolation layer is disposed on a side wall of said mesa portion and said dielectric layer, and extends from said electrode layer at more than half of said height of said mesa portion in a direction toward said dielectric layer; and
said passivation layer at least covers a surface of said isolation layer.

12. The power device of claim 10, wherein:
said electrode layer has a welding region for electric connection, said welding region being located at a surface of said electrode layer opposite to said drift layer;
said isolation layer extends from a periphery of said welding region in a direction toward said dielectric layer and at least covers a part of a surface of said dielectric layer; and
said passivation layer covers said isolation layer.

13. The power device of claim 12, wherein, in a direction from a side wall of said mesa portion of said electrode layer toward said dielectric layer, said isolation layer has a slope surface that extends away from said side wall.

14. The power device of claim 13, wherein, in a cross section of said power device:
said dielectric layer and said side wall of said electrode layer has a contact point,
said slope surface has a selected point that is nearest to said contact point, and
a tangent line which passes through said selected point and which extends in the direction from said side wall of said mesa portion of said electrode layer toward said dielectric layer forms a second included angle with a top surface of said drift layer, said second included angle ranging from 30° to 45°.

15. The power device of claim 2, further comprising a dielectric layer which extends from a periphery of said active region to cover said terminal region,
wherein
said active region and said terminal region are disposed in said drift layer distal from said substrate,
said electrode layer has a mesa portion that extends above said dielectric layer, said mesa portion has a side wall that connects to and extends away from said dielectric layer and that forms a first included angle with said dielectric layer,
said electrode layer has a welding region for electrical connection, said welding region being located at a surface of said electrode layer opposite to said drift layer,
said isolation layer is disposed on said electrode layer and said dielectric layer, and is configured so that an angle of inclination of said isolation layer extending from a periphery of said welding region toward said dielectric layer is smaller than said first included angle, and
said passivation layer is disposed on said isolation layer.

16. The power device of claim 15, wherein:
said mesa portion has a height;
said isolation layer is disposed on said side wall and said dielectric layer, and extends from said mesa portion of said electrode layer at more than half of said height of said mesa portion in a direction toward said dielectric layer; and
said passivation layer covers at least a surface of said isolation layer.

17. The power device of claim 16, wherein in a direction from said side wall of said mesa portion of said electrode layer toward said dielectric layer, said isolation layer has a slope surface that extends away from said side wall.

18. The power device of claim 17, wherein, in a cross section of said power device:
said dielectric layer and said side wall has a contact point,
said slope surface has a selected point that is nearest to said contact point, and
a tangent line which passes through said selected point and which extends in a direction from said side wall of said mesa portion of said electrode layer toward said dielectric layer forms a second included angle with a top surface of said drift layer, said second included angle ranging from 30° to 45°.

19. The power device of claim 1, further comprising a dielectric layer which extends from a periphery of said active region to cover said terminal region,
wherein
said active region and said terminal region are disposed in said drift layer distal from said substrate,
said electrode layer has a mesa portion that extends above said dielectric layer and that has a side wall, said side wall being connected to said dielectric layer and forming a first included angle with said dielectric layer, and
said isolation layer fills a corner defined by said side wall and said dielectric layer and having first included angle so that said isolation layer is disposed on said electrode layer and said dielectric layer.

20. The power device of claim 19, wherein said side wall of said mesa portion has a height, said isolation layer extends from said side wall at more than half of said height of side wall in a direction toward said dielectric layer, and said passivation layer at least covers said isolation layer.

21. The power device of claim 19, wherein:
said electrode layer has a welding region for electrical connection, said welding region being located at a surface of said electrode layer opposite to said drift layer;

said isolation layer extends from a periphery of said welding region in a direction toward said dielectric layer; and said passivation layer covers said isolation layer.

22. The power device of claim 21, wherein, in a direction from said side wall of said mesa portion of said electrode layer toward said dielectric layer, said isolation layer has a slope surface that extends away from said side wall.

23. The power device of claim 22, wherein, in a cross section of said power device:

said dielectric layer and said side wall of said mesa portion has a contact point, said slope surface has a selected point that is nearest to said contact point, and a tangent line which passes through said selected point and which extends in the direction from said side wall of said mesa portion of said electrode layer toward said dielectric layer forms a second included angle with a top surface of said drift layer, said second included angle ranging from 30° to 45°.

24. A method for manufacturing a power device, comprising:

providing a power structure that includes:
  a substrate,
  a drift layer disposed on the substrate,
  an active region disposed in the drift layer,
  a terminal region disposed in the drift layer and surrounds the active region,
  a dielectric layer disposed on the drift layer and extending from a periphery of the active region to cover the terminal region,
  an electrode layer disposed on the active region, and
  a Schottky contact layer disposed between the active region and the electrode layer;

forming an isolation layer on the electrode layer; and forming a passivation layer that covers at least a portion of the isolation layer and extends in a direction toward the terminal region, the passivation layer and the electrode layer being separated by the isolation layer, wherein the electrode layer has a mesa portion that extends above the dielectric layer, the mesa portion having a side wall proximate to the dielectric layer and a top surface distal from the drift layer, and the side wall of the mesa portion is connected to the dielectric layer.

25. The method of claim 24, wherein the step of forming the isolation layer includes:

depositing a material on a surface of the power structure distal from the substrate; and patterning the material to remove a part of the material disposed on the top surface of the electrode layer and a surface of the dielectric layer, so as to form the isolation layer on the side wall of the mesa portion, wherein the isolation layer has a thermal expansion coefficient a, the electrode layer has a thermal expansion coefficient b, the passivation layer has a thermal expansion coefficient c, and a>b>c.

26. The method of claim 24, wherein the step of forming the isolation layer includes:

depositing a material on a surface of the power structure distal from the substrate; and patterning the material to remove a part of the material disposed on a central region of the top surface of the electrode layer and a surface of the dielectric layer, so as to form the isolation layer on a terminal region of the top surface of the electrode layer surrounding the central region and on the side wall of the mesa portion, wherein the isolation layer has a thermal expansion coefficient a, the electrode layer has a thermal expansion coefficient b, the passivation layer has a thermal expansion coefficient c, and a>b>c.

27. A method for manufacturing a power device, comprising:

providing a first power structure that includes:
  a substrate,
  a drift layer disposed on the substrate,
  an active region and a terminal region disposed in the drift layer distal from the substrate;
  a dielectric layer disposed on the drift layer and extending from a periphery of the active region to cover the terminal region,
  an electrode layer disposed on the active region, the electrode layer having a mesa portion that extends above the dielectric layer, the mesa portion having a side wall proximate to the dielectric layer and a top surface distal from the drift layer, the side wall of the mesa portion being connected to the dielectric layer so that an included angle is formed between the mesa portion and the dielectric layer, and
  a Schottky contact layer disposed between the active region and the electrode layer;

forming an isolation layer on the electrode layer and the dielectric layer, the isolation layer having a slope surface extending in a direction from the side wall of the mesa portion toward the dielectric layer and away from the side wall;

forming a photoresist on the isolation layer and patterning the photoresist so as to form a through hole in the photoresist that exposes a part of the isolation layer disposed on a central region of the electrode layer;

patterning the isolation layer to remove the part of the isolation layer exposed from the through hole; and forming a passivation layer that covers at least a portion of the isolation layer, the passivation layer and the electrode layer being at least partially separated by the isolation layer, wherein the isolation layer has a thermal expansion coefficient a, the electrode layer has a thermal expansion coefficient b, the passivation layer has a thermal expansion coefficient c, and a>b>c.

* * * * *